US011439008B2

(12) United States Patent
Fang et al.

(10) Patent No.: US 11,439,008 B2
(45) Date of Patent: Sep. 6, 2022

(54) PACKAGE WITH SUBSTRATE COMPRISING VARIABLE THICKNESS SOLDER RESIST LAYER

(71) Applicant: QUALCOMM Incorporated, San Diego, CA (US)

(72) Inventors: Kun Fang, San Diego, CA (US); Jaehyun Yeon, San Diego, CA (US); Suhyung Hwang, Rancho Mission Viejo, CA (US); Hyunchul Cho, Suwon (KR); Boyu Tseng, Hsinchu County (TW)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/149,498

(22) Filed: Jan. 14, 2021

(65) Prior Publication Data

US 2022/0053639 A1    Feb. 17, 2022

Related U.S. Application Data

(60) Provisional application No. 63/065,317, filed on Aug. 13, 2020.

(51) Int. Cl.
*H05K 1/11* (2006.01)
*H01L 21/48* (2006.01)
*H05K 1/02* (2006.01)

(52) U.S. Cl.
CPC ............ *H05K 1/113* (2013.01); *H01L 21/486* (2013.01); *H05K 1/024* (2013.01)

(58) Field of Classification Search
CPC .......... H05K 1/113; H05K 1/024; H05K 1/11; H01L 21/486

USPC ......................................................... 361/767
See application file for complete search history.

(56) References Cited

U.S. PATENT DOCUMENTS

| | | | |
|---|---|---|---|
| 2013/0025782 A1 | 1/2013 | Higo et al. | |
| 2017/0117252 A1 | 4/2017 | Baik et al. | |
| 2021/0028340 A1* | 1/2021 | Taniguchi | H05K 1/0206 |
| 2021/0392757 A1* | 12/2021 | Chen | H05K 3/1258 |

FOREIGN PATENT DOCUMENTS

| | | |
|---|---|---|
| DE | 102015110013 A1 | 12/2015 |
| EP | 2482623 A1 | 8/2012 |
| JP | 2011119567 A | 6/2011 |

OTHER PUBLICATIONS

International Search Report and Written Opinion—PCT/US2021/036998—ISA/EPO—dated Oct. 7, 2021.

* cited by examiner

*Primary Examiner* — Tremesha S Willis
(74) *Attorney, Agent, or Firm* — Loza & Loza, LLP/Qualcomm

(57) ABSTRACT

A package that includes a substrate and an electrical component coupled to the substrate. The substrate includes at least one dielectric layer, a plurality of interconnects located in the at least one dielectric layer, and a solder resist layer located over a surface of the at least one dielectric layer. The solder resist layer includes a first solder resist layer portion comprising a first thickness, and a second solder resist layer portion comprising a second thickness that is less than the first thickness. The electrical component is located over the second solder resist layer portion.

25 Claims, 18 Drawing Sheets

PROFILE VIEW

PROFILE VIEW

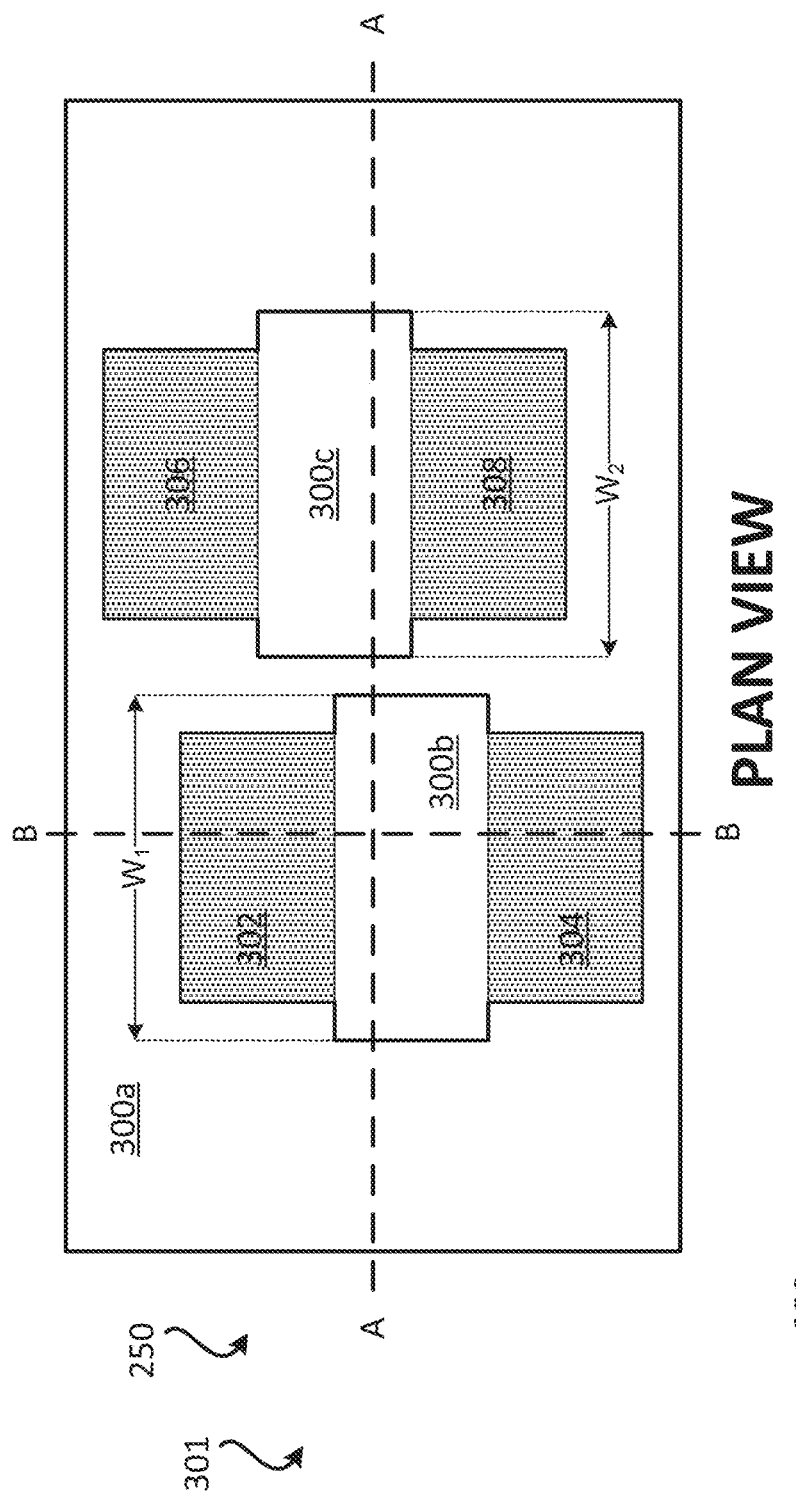
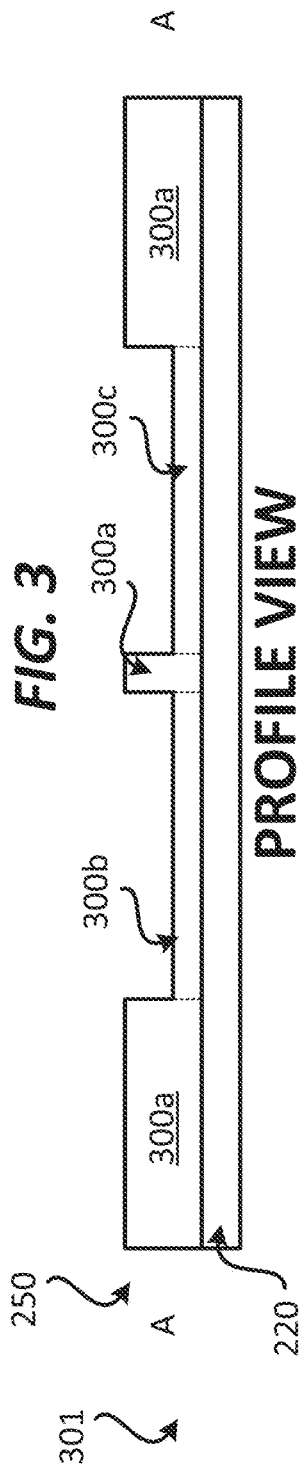

PROFILE VIEW

PROFILE VIEW

PROFILE VIEW

PROFILE VIEW

PROFILE VIEW

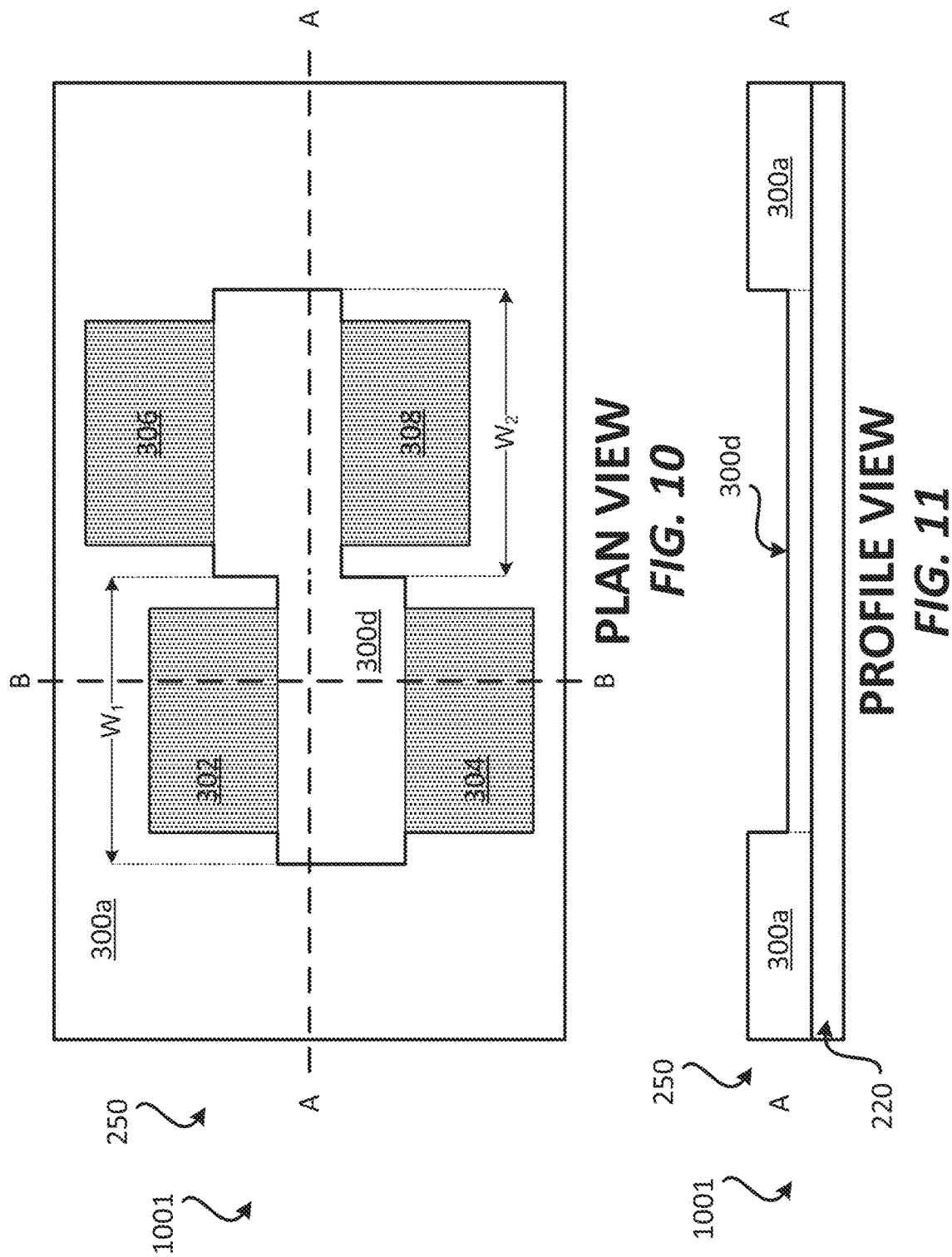

PROFILE VIEW

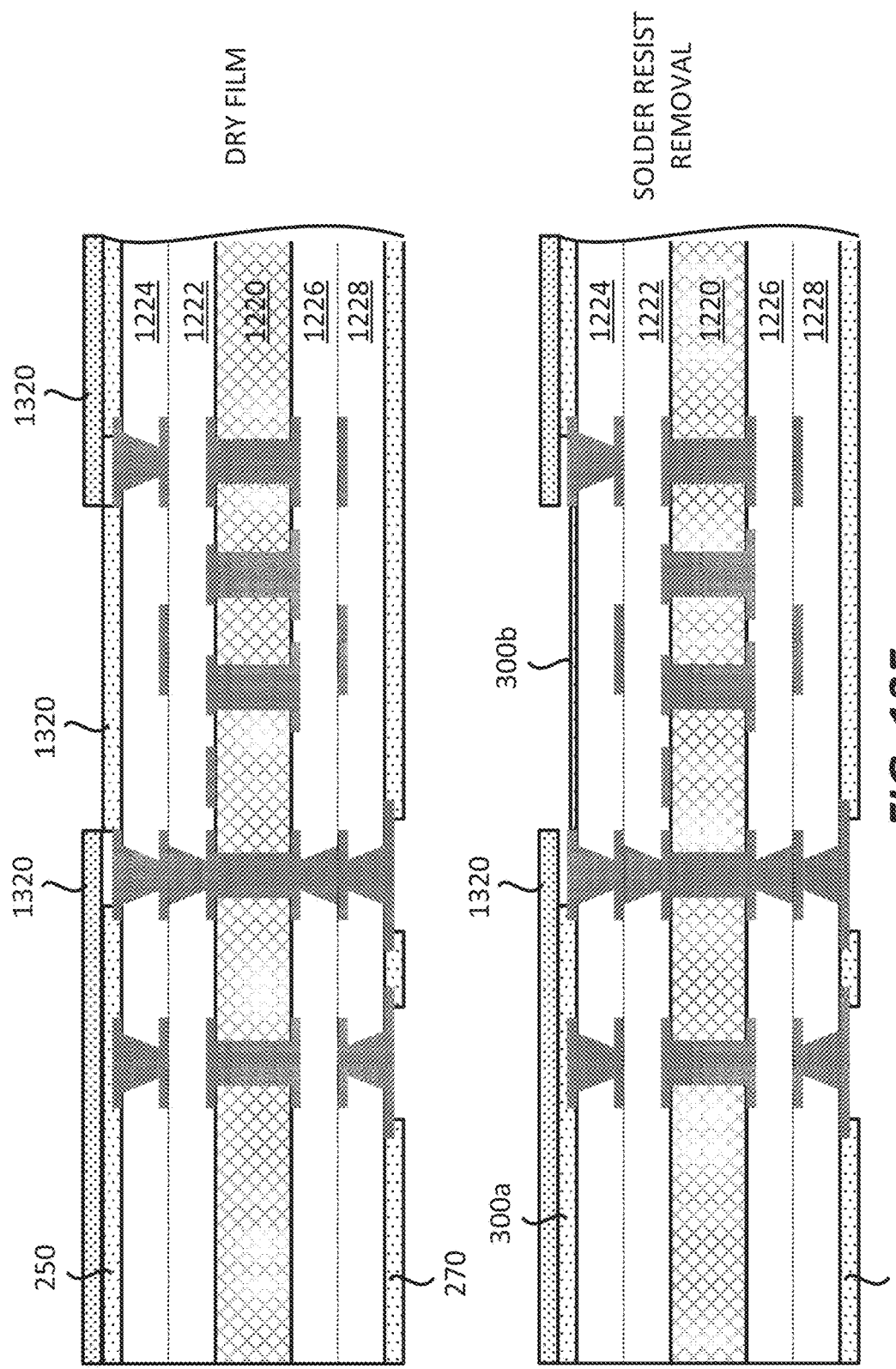

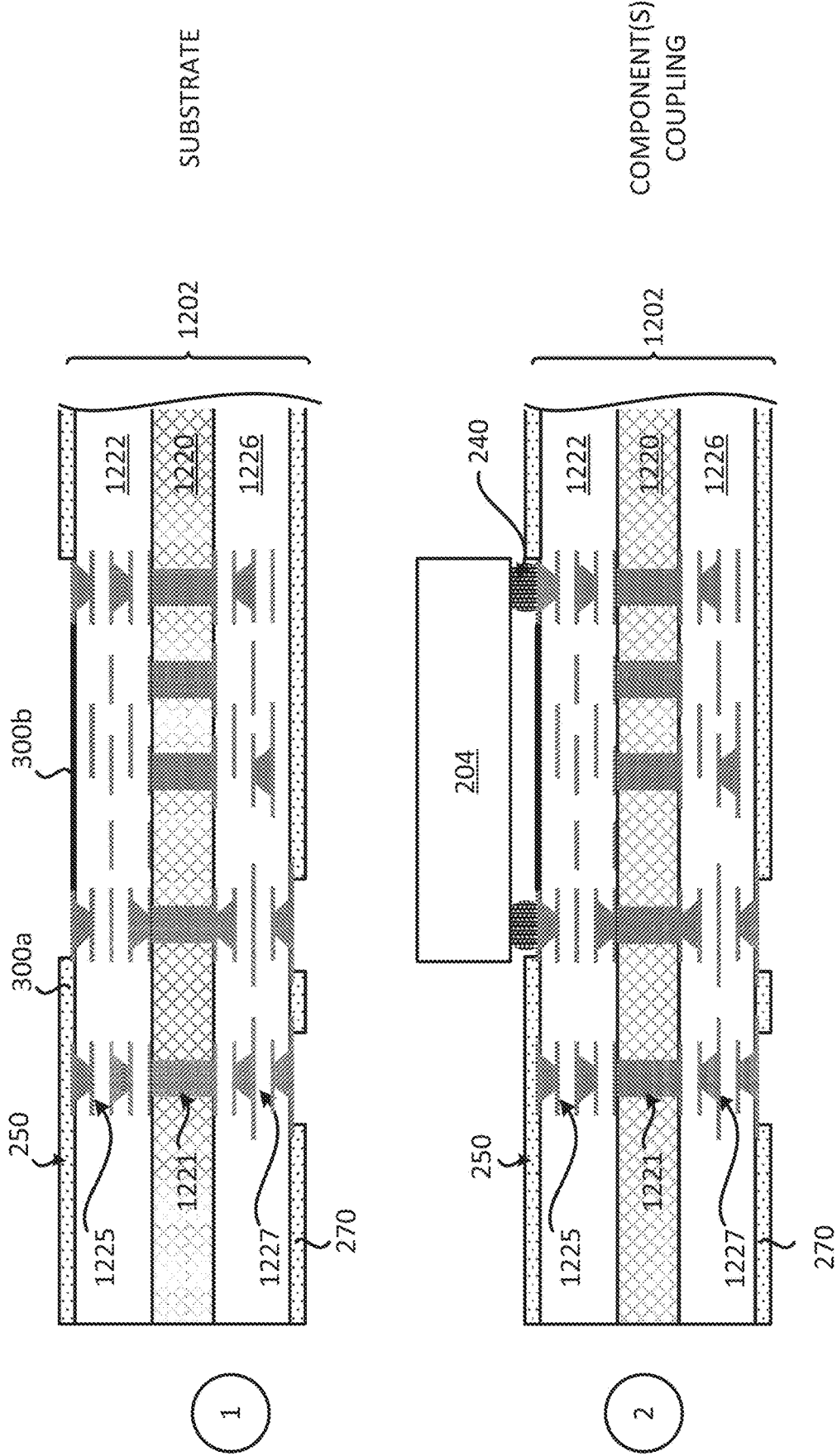

PACKAGE WITH SUBSTRATE COMPRISING VARIABLE THICKNESS SOLDER RESIST LAYER

CROSS-REFERENCE/CLAIM OF PRIORITY TO RELATED APPLICATION

The present application claims priority to and the benefit of U.S. Provisional Application No. 63/065,317, filed on Aug. 13, 2020, and titled, "PACKAGE AND SUBSTRATE COMPRISING VARIABLE THICKNESS SOLDER RESIST LAYER", which is hereby expressly incorporated by reference.

FIELD

Various features relate to packages and substrates, but more specifically to a substrate that includes a solder resist layer.

BACKGROUND

FIG. 1 illustrates a package 100 that includes a substrate 102, an integrated device 104 and an integrated device 106. The substrate 102 includes at least one dielectric layer 120, a plurality of interconnects 122 and a plurality of solder interconnects 124. A plurality of solder interconnects 144 is coupled to the substrate 102 and the integrated device 104. A plurality of solder interconnects 164 is coupled to the substrate 102 and the integrated device 106. The plurality of solder interconnects 124 is coupled to the plurality of interconnects 122. There is an ongoing need to provide reliable packages and substrates.

SUMMARY

Various features relate to packages and substrates, but more specifically to a substrate that includes a solder resist layer.

One example provides a substrate that includes at least one dielectric layer, a plurality of interconnects located in the at least one dielectric layer, and a solder resist layer located over a surface of the at least one dielectric layer. The solder resist layer includes a first solder resist layer portion comprising a first thickness, and a second solder resist layer portion comprising a second thickness that is less than the first thickness.

Another example provides a package that includes a substrate and an electrical component coupled to the substrate. The substrate includes at least one dielectric layer, a plurality of interconnects located in the at least one dielectric layer, and a solder resist layer located over a surface of the at least one dielectric layer. The solder resist layer includes a first solder resist layer portion comprising a first thickness, and a second solder resist layer portion comprising a second thickness that is less than the first thickness. The electrical component is located over the second solder resist layer portion.

Another example provides a method for fabricating a substrate. The method forms at least one dielectric layer. The method forms a plurality of interconnects in the at least one dielectric layer. The method forms a solder resist layer over a surface of the at least one dielectric layer. Forming the solder resist layer includes forming a first solder resist layer portion comprising a first thickness. Forming the solder resist layer includes forming a second solder resist layer portion comprising a second thickness that is less than the first thickness.

BRIEF DESCRIPTION OF THE DRAWINGS

Various features, nature and advantages may become apparent from the detailed description set forth below when taken in conjunction with the drawings in which like reference characters identify correspondingly throughout.

FIG. 3 illustrates a plan view of a substrate with a variable thickness solder resist layer.

FIG. 4 illustrates a profile view of a substrate with a variable thickness solder resist layer.

FIG. 10 illustrates a plan view of a substrate with a variable thickness solder resist layer.

FIG. 11 illustrates a profile view of a substrate with a variable thickness solder resist layer.

FIGS. 13A-13F illustrate an exemplary sequence for fabricating a substrate that includes a variable thickness solder resist layer.

FIGS. 15A-15B illustrate an exemplary sequence for fabricating a package that includes a substrate with a variable thickness solder resist layer.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate and an electrical component coupled to the substrate. The substrate includes at least one dielectric layer, a plurality of interconnects located in the at least one dielectric layer, and a solder resist layer located over a surface of the at least one dielectric layer. The solder resist layer includes a variable thickness solder resist layer. The solder resist layer includes a first solder resist layer portion comprising a first thickness, and a second solder resist layer portion comprising a second thickness that is less than the first thickness. The electrical component is located over the second solder resist layer portion. The solder resist layer further includes a third solder resist layer having the second thickness. The first solder resist layer portion is located between the second solder resist layer portion and the third solder resist layer portion. The first solder resist layer portion, the second solder resist layer portion and/or the third solder resist layer portion may be continuous portions and/or contiguous portions. As will be further described below, the presence of the second solder resist layer portion and the third solder resist layer portion on both sides of the first solder resist layer portion helps prevent the first solder resist layer portion (which has a greater thickness) from delaminating from the at least one dielectric layer, which helps provide a more reliable substrate and a thus a more reliable package.

Figure 1:
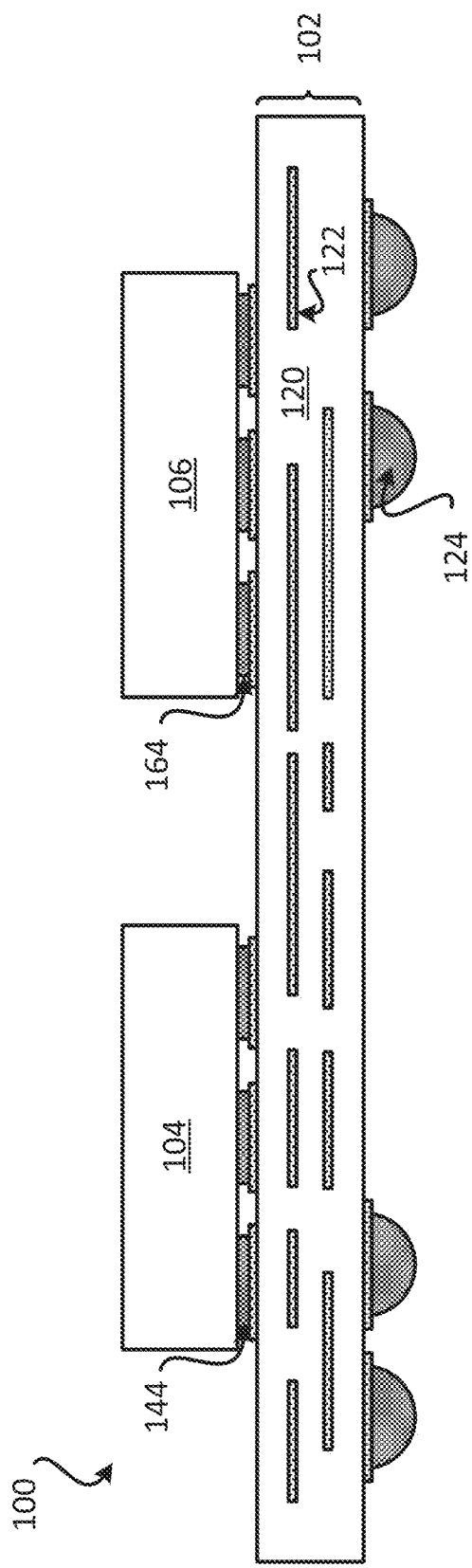
FIG. 1 illustrates a profile view of a package that includes a substrate and integrated devices coupled to the substrate.
Figure 2:
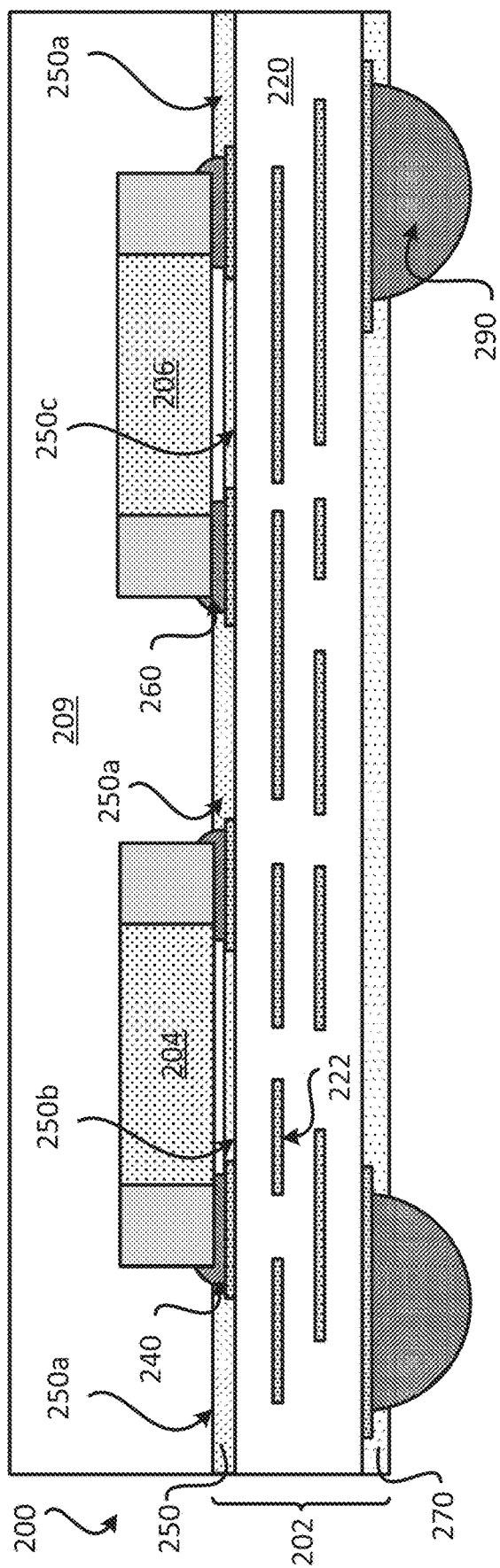
FIG. 2 illustrates a profile view of a package that includes a substrate with a variable thickness solder resist layer.

Exemplary Packages with a Substrate Having a
Variable Thickness Solder Resist Layer FIG. 2 illustrates a profile view of a package 200 that includes electrical components and a substrate comprising a variable thickness solder resist layer. The package 200 includes a substrate 202, an electrical component 204, an electrical component 206, and an encapsulation layer 209. The electrical component 204 is coupled to a first surface (e.g., top surface) of the substrate 202 through a plurality of solder interconnects 240. The electrical component 206 is coupled to the first surface of the substrate 202 through a plurality of solder interconnects 260. An encapsulation layer 209 may be coupled to the first surface of the substrate 202. The encapsulation layer 209 may be located over the substrate 202, the electrical component 204 and the electrical component 206. The encapsulation layer 209 may encapsulate the electrical component 204 and the electrical component 206. The encapsulation layer 209 may include a mold, a resin and/or an epoxy. The electrical component 204 and/or the electrical component 206 may include a passive device and/or an integrated passive device.

As shown in FIG. 2, the substrate 202 includes at least one dielectric layer 220, a plurality of interconnects 222, a solder resist layer 250 and a solder resist layer 270. The substrate 202 may be a coreless substrate. The plurality of interconnects 222 is located in the at least one dielectric layer 220. The plurality of interconnects 222 may include a plurality of surface interconnects that is located over a surface (e.g., first surface, second surface) of the at least one dielectric layer 220. The solder resist layer 250 may be located over the first surface of the substrate 202. The solder resist layer 270 may be located over the second surface (e.g., bottom surface) of the substrate 202. A plurality of solder interconnects 290 is coupled to the substrate 202.

The solder resist layer 250 may include different portions with different thicknesses. For example, the solder resist layer 250 may include a first solder resist layer portion 250a, a second solder resist layer portion 250b and a third solder resist layer portion 250c. The first solder resist layer portion 250a may have a first thickness. The second solder resist layer portion 250b may have a second thickness that is less than the first thickness. The third solder resist layer portion 250c may have the second thickness. However, it is noted that the third solder resist layer portion 250c may have a third thickness that is different than the first thickness and the second thickness. The third thickness may be less than the first thickness. The third thickness may be greater or less than the second thickness.

At least one portion of the first solder resist layer portion 250a may be located between the second solder resist layer portion 250b and the third solder resist layer portion 250c. The first solder resist layer portion 250a may be located around the second solder resist layer portion 250b and the third solder resist layer portion 250c. In some implementations, the second solder resist layer portion 250b and the third solder resist layer portion 250c are separated by approximately 45 micrometers or less. In some implementations, a center-to-center distance between the second solder resist layer portion 250b and the third solder resist layer portion 250c is approximately at least 45 micrometers. As will be further illustrated and described below, the presence of the second solder resist layer portion 250b and the third solder resist layer portion 250c on both sides of a portion of the first solder resist layer portion 250a helps prevent portions of the first solder resist layer portion 250a from delaminating from the at least one dielectric layer 220, which helps provide a more reliable substrate 202 and a more reliable package 200. The first solder resist layer portion 250a, the second solder resist layer portion 250b and/or the third solder resist layer portion 250c may be continuous and/or contiguous.

It is noted that the solder resist layer 270 may also include a variable thickness solder resist layer in a similar manner as described for the solder resist layer 250. However, the solder resist layer 270 may have a uniform thickness.

The electrical component 204 is coupled to the substrate 202 such that the electrical component 204 is located over the second solder resist layer portion 250b. An opening and/or a cavity in the solder resist layer 250 may expose the second solder resist layer portion 250b. Such an opening and/or a cavity may be located over the second solder resist layer portion 250b. The electrical component 204 may be located over the opening of the solder resist layer 250 that exposes the second solder resist layer portion 250b. The electrical component 206 is coupled to the substrate 202 such that the electrical component 206 is located over the third solder resist layer portion 250c. Another opening and/or another cavity in the solder resist layer 250 may expose the third solder resist layer portion 250c. Such another opening and/or another cavity may be located over the third solder resist layer portion 250c. The electrical component 206 may be located over the opening of the solder resist layer 250 that exposes the third solder resist layer portion 250c. The encapsulation layer 209 may be located between the electrical component 204 and the second solder resist layer portion 250b. The encapsulation layer 209 may fill (e.g., partially fill or completely fill) the cavity and/or opening between the electrical component 204 and the second solder resist layer portion 250b. The encapsulation layer 209 may be located between the electrical component 206 and the third solder resist layer portion 250c. The encapsulation layer 209 may fill (e.g., partially fill or completely fill) the cavity and/or opening between the electrical component 206 and the third solder resist layer portion 250c.

FIGS. 3-7 illustrate part of a substrate that includes a variable thickness solder resist layer. FIG. 3 illustrates a plan view of a substrate 301 that includes a variable thickness solder resist layer. The substrate 301 shown in FIG. 3 may be any substrate, including a coreless substrate or a cored substrate. The substrate 301 may be implemented as the substrate 202. The substrate 301 includes the solder resist layer 250, an interconnect 302, an interconnect 304, an interconnect 306 and an interconnect 308. The interconnects 302, 304, 306 and/or 308 may be surface interconnects (e.g., pads) located over at least one dielectric layer (e.g., 220). The solder resist layer 250 may surround (e.g., laterally surround) the interconnects 302, 304, 306 and/or 308. The solder resist layer 250 may be located over portions of the interconnects 302, 304, 306. As shown in FIG. 3, the solder resist layer 250 includes a first solder resist layer portion 300a, a second solder resist layer portion 300b and a third solder resist layer portion 300c. In some implementations, the second solder resist layer portion 300b and the third solder resist layer portion 300c are separated by approximately 45 micrometers or less. The first solder resist layer portion 300a may include a strip portion between the second solder resist layer portion 300b and the third solder resist layer portion 300c, where the strip portion has a width of approximately 45 micrometers or less. The exposed portions of the interconnects 302 and 304, and the second solder resist layer portion 300b, may have the shape of a cross. An opening and/or a cavity in the solder resist layer 250 may expose the interconnects 302 and 304, and the second solder resist layer portion 300b. Such an opening and/or a cavity may be located over the interconnects 302 and 304, and/or the second solder resist layer portion 300b. The opening and/or the cavity in the solder resist layer 250 that exposes the interconnects 302 and 304, and the second solder resist layer portion 300b may form the shape of a cross. The exposed portions of the interconnects 306 and 308, and the third solder resist layer portion 300c, may have the shape of a cross. Another opening and/or another cavity in the solder resist layer 250 may expose the interconnects 306 and 308, and the third solder resist layer portion 300c. Such another opening and/or another cavity may be located over the interconnects 306 and 308, and/or the third solder resist layer portion 300c. The another opening and/or another cavity in the solder resist layer 250 that exposes the interconnects 306 and 308, and the third solder resist layer portion 300c may form the shape of a cross.

FIG. 4 illustrates a profile view of the substrate 301 across an AA cross-section. The substrate 301 includes the solder resist layer 250 and the at least one dielectric layer 220. The first solder resist layer portion 300a is located around the second solder resist layer portion 300b and the third solder resist layer portion 300c. A portion of the first solder resist layer portion 300a is located between the second solder resist layer portion 300b and the third solder resist layer portion 300c. The portion of the first solder resist layer portion 300a that is located between the second solder resist layer portion 300b and the third solder resist layer portion 300c may be relatively narrow. However, because the second solder resist layer portion 300b and the third solder resist layer portion 300c are located on either and/or both sides of the narrow portion of the first solder resist layer portion 250a, the likelihood of the narrow portion delaminating from the at least one dielectric layer 220 is reduced and/or eliminated, thus providing a more reliable and robust substrate.

The first solder resist layer portion 300a may be the main portion of the solder resist layer 250. A majority of the solder resist layer 250 may be defined by the first solder resist layer portion 300a. The first solder resist layer portion 300a may have a thickness of approximately 12-15 micrometers. The second solder resist layer portion 300b and/or the third solder resist layer portion 300c may have a thickness of approximately 0-15 micrometers (e.g., 1-12 micrometers).

The second solder resist layer portion 300b and/or the third solder resist layer portion 300c has a thickness that is less than the thickness of the first solder resist layer portion 300a. The differential thickness between the first solder resist layer portion 300a and the second solder resist layer portion 300b or the third solder resist layer portion 300c may affect the encapsulation layer flow underneath a component located over the second solder resist layer portion 300b and/or the third solder resist layer portion 300c. In some implementations, the second solder resist layer portion 300b or the third solder resist layer portion 300c may be free of solder resist layer. That is, in some implementations, one of the second solder resist layer portion 300b or the third solder resist layer portion 300c may not be present, exposing the dielectric layer (e.g., 220). For example, in some implementations, there might not be a third solder resist layer portion 300c, leaving the dielectric layer 220 exposed (which may be subsequently covered by an encapsulation layer). When there is no solder resist layer over the dielectric layer and/or when a portion of the solder resist layer has a lower thickness than the thickness of the first solder resist layer portion 300a, this area may be considered as an opening and/or a cavity of the solder resist layer. Thus, in the example where there is no third solder resist layer portion 300c, the area may be called an opening and/or a cavity in the solder resist layer 250. In some implementations, areas of the substrate (e.g., 202, 301) that are not covered by the first solder resist layer portion 300a may have the shape of a cross. The first solder resist layer portion 300a, the second solder resist layer portion 300b and/or the third solder resist layer portion 300c may be continuous and/or contiguous.

The width (e.g., $W_1$ of the second solder resist layer portion 300b may be bigger (e.g., wider) than the width of the interconnects 302 and 304. The width (e.g., $W_1$) of the second solder resist layer portion 300b may be bigger (e.g., wider) than the width of an electrical component that may be positioned over the second solder resist layer portion 300b. A cavity and/or an opening that is located over the second solder resist layer portion 300b may have a width (e.g., $W_1$) that is bigger than the width of an electrical component that is positioned over the second solder resist layer portion 300b. This design allows an encapsulation layer to flow underneath the electrical component and be formed between the electrical component and the second solder resist layer portion 300b (or dielectric layer, if there is no second solder resist layer portion 300b).

Similarly, the width (e.g., $W_2$) of the third solder resist layer portion 300c may be bigger (e.g., wider) than the width of the interconnects 306 and 308. The width (e.g., $W_2$) of the third solder resist layer portion 300c may be bigger (e.g., wider) than the width of an electrical component that is positioned over the third solder resist layer portion 300c. A cavity and/or an opening that is located over the third solder resist layer portion 300c may have a width (e.g., $W_2$) that is bigger than the width of an electrical component that is positioned over the second solder resist layer portion 300b. This design allows an encapsulation layer to flow underneath the electrical component and be formed between the electrical component and the third solder resist layer portion 300c (or dielectric layer, if there is no third solder resist layer portion 300c).

As shown in FIG. 4, the first solder resist layer portion 300a may have a first thickness. The second solder resist layer portion 300b may have a second thickness that is less than the first thickness. The third solder resist layer portion 300c may have the second thickness. However, it is noted that the third solder resist layer portion 300c may have a third thickness that is different than the first thickness and the second thickness. The third thickness may be less than the first thickness. The third thickness may be greater or less than the second thickness. As mentioned above, in some implementations, the second solder resist layer portion 300*b* or the third solder resist layer portion 300*c* may not be there (e.g., one of the portions may have a thickness of zero), exposing the dielectric layer 220.

Figure 5:
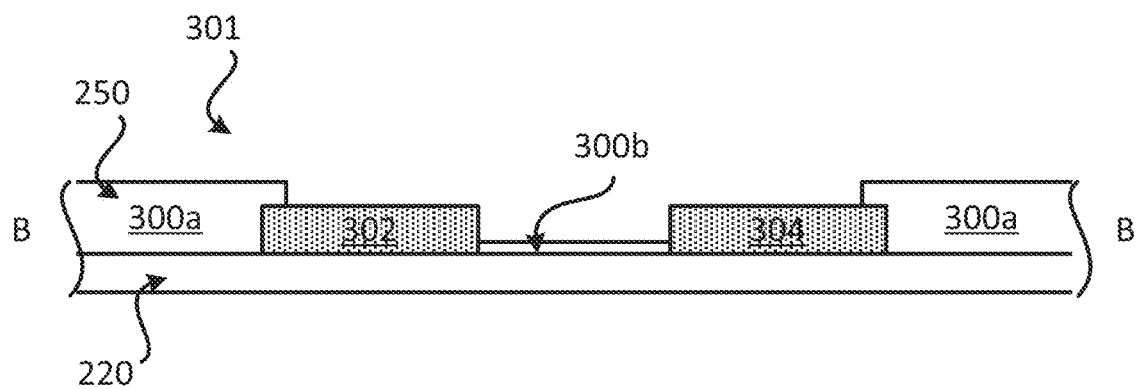
FIG. 5 illustrates a profile view of a substrate with a variable thickness solder resist layer.

FIG. 5 illustrates a profile view of an example of the substrate 301 across a BB cross-section. The substrate 301 includes the at least one dielectric layer 220, the solder resist layer 250, the interconnect 302, and the interconnect 304. The second solder resist layer portion 300*b* may be located between the interconnect 302 and the interconnect 304. The interconnects 302 and 304 may have an interconnect thickness. The interconnect thickness may be less than the first thickness of the first solder resist layer portion 300*a*. The interconnect thickness may be greater than the second thickness of the second solder resist layer portion 300*b*. The second thickness of the second solder resist layer portion 300*b* may be less than the interconnect thickness of the interconnects 302 and 304.

Figure 6:
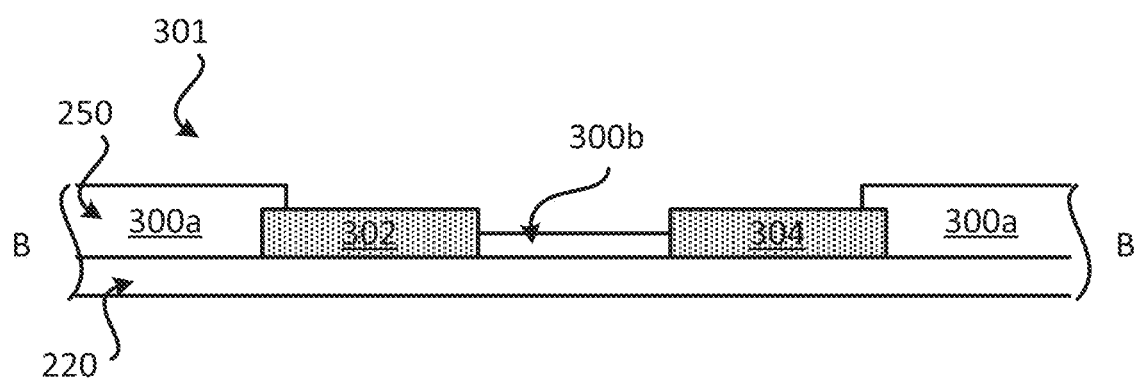
FIG. 6 illustrates a profile view of a substrate with a variable thickness solder resist layer.

FIG. 6 illustrates another profile view of an example of the substrate 301 across a BB cross-section. The substrate 301 of FIG. 6 is similar to the substrate 301 of FIG. 5. However, the thickness of the second solder resist layer portion 300*b* in FIG. 6 is greater than the thickness of the second solder resist layer portion 300*b* of FIG. 5.

Figure 7:
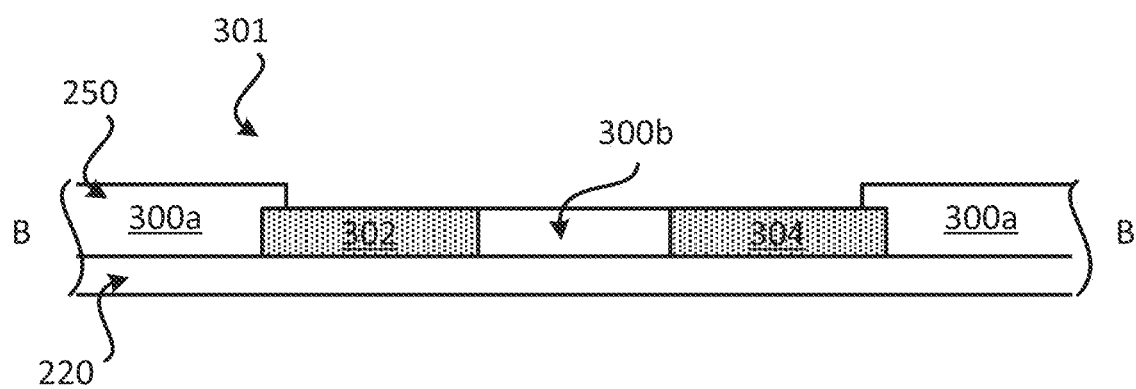
FIG. 7 illustrates a profile view of a substrate with a variable thickness solder resist layer.

FIG. 7 illustrates another profile view of an example of the substrate 301 across a BB cross-section. The substrate 301 includes the at least one dielectric layer 220, the solder resist layer 250, the interconnect 302, and the interconnect 304. The second solder resist layer portion 300*b* may be located between the interconnect 302 and the interconnect 304. The interconnects 302 and 304 may have an interconnect thickness. The interconnect thickness may be less than the first thickness of the first solder resist layer portion 300*a*. The interconnect thickness may be approximately the same as the second thickness of the second solder resist layer portion 300*b*.

Figure 8:
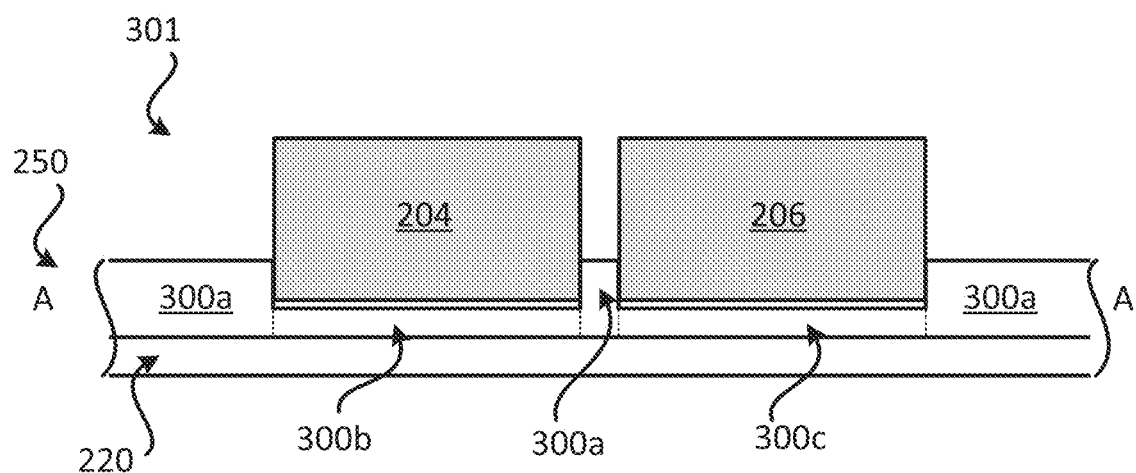
FIG. 8 illustrates a profile view of a substrate with a variable thickness solder resist layer.
Figure 9:
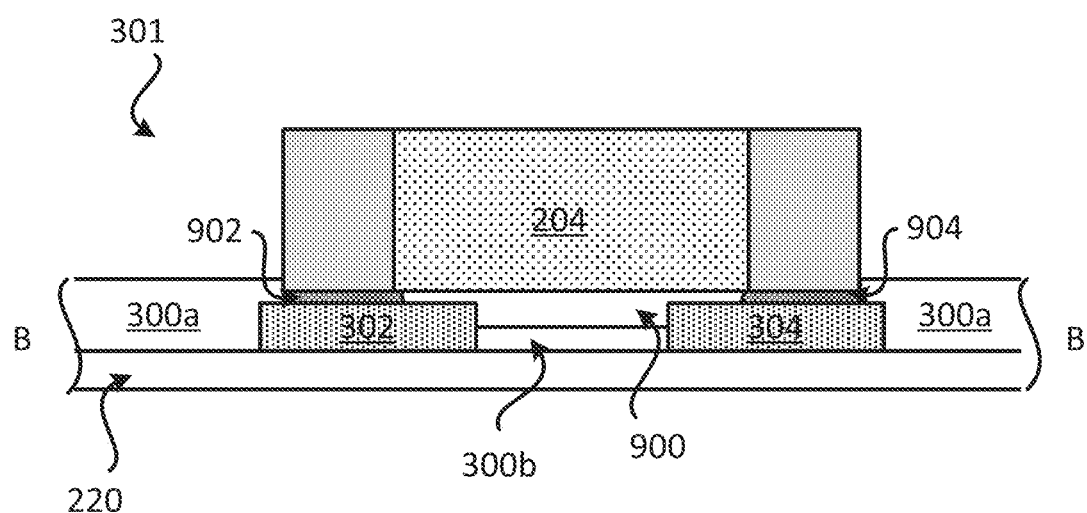
FIG. 9 illustrates a profile view of a substrate with a variable thickness solder resist layer.

FIGS. 8 and 9 illustrate electrical components coupled to a substrate with a variable thickness solder resist layer. FIG. 8 illustrates a profile view across an AA cross section of the electrical components 204 and 206 located over the substrate 301. The electrical component 204 is located over the second solder resist layer portion 300*b*. The electrical component 206 is located over the third solder resist layer portion 300*c*. A portion of the first solder resist layer portion 300*a* may be located between the electrical component 204 and the electrical component 206. There may be an encapsulation layer (e.g., 209) located between the electrical component 204 and the second solder resist layer portion 300*b*. There may be an encapsulation layer (e.g., 209) located between the electrical component 206 and the third solder resist layer portion 300*c*.

FIG. 9 illustrates a profile view across a BB cross section of the electrical component 204 located over the substrate 301. The electrical component 204 is located over the second solder resist layer portion 300*b* and the interconnects 302 and 304. The electrical component 204 may be coupled to the interconnect 302 through a solder interconnect 902. The electrical component 204 may be coupled to the interconnect 304 through a solder interconnect 904. There is a gap 900 between the electrical component 204 and the second solder resist layer portion 300*b*. The gap 900 may be filled (partially or completely) with an encapsulation layer (e.g., 209). Thus, there may be an encapsulation layer (e.g., 209) located between the electrical component 204 and the second solder resist layer portion 300*b*.

FIGS. 10-11 illustrate part of a substrate that includes a variable thickness solder resist layer. FIG. 10 illustrates a plan view of a substrate 1001 that includes a variable thickness solder resist layer. The substrate 1001 may be implemented as the substrate 202. The substrate 1001 includes the solder resist layer 250, an interconnect 302, an interconnect 304, an interconnect 306 and an interconnect 308. The interconnects 302, 304, 306 and/or 308 may be surface interconnects (e.g., pads) located over at least one dielectric layer (e.g., 220). The solder resist layer 250 may surround (e.g., laterally surround) the interconnects 302, 304, 306 and/or 308. The solder resist layer 250 may be located over portions of the interconnects 302, 304, 306. As shown in FIG. 10, the solder resist layer 250 includes a first solder resist layer portion 300*a* and a second solder resist layer portion 300*d*. As shown in FIG. 10, areas of the substrate (e.g., 202, 301, 1001) that are not covered by the first solder resist layer portion 300*a* may have the shape of a cross and/or a double cross. An opening and/or a cavity in the solder resist layer 250 may expose the interconnects 302, 304, 306, 308, and the second solder resist layer portion 300*d*. The opening and/or a cavity in the solder resist layer 250 that exposes the interconnects 302, 304, 306, 308, and the second solder resist layer portion 300*d* may form the shape of a cross and/or a double cross. In some implementations, an electrical component 204 may be coupled to the substrate 1001 such that the electrical component 204 is located over the interconnects 302 and 304, and a first portion of the second solder resist layer 300*d*. Another electrical component 206 may be coupled to the substrate 1001 such that the electrical component 206 is located over the interconnects 306 and 308, and a second portion of the second solder resist layer 300*d*. An opening and/or a cavity in the solder resist layer as described in the disclosure may include a trench in the solder resist layer.

The width (e.g., $W_1$) of the first portion of the second solder resist layer portion 300*d* may be bigger (e.g., wider) than the width of the interconnects 302 and 304. The width (e.g., $W_1$) of the first portion of the second solder resist layer portion 300*d* may be bigger (e.g., wider) than the width of an electrical component (e.g., 204) that may be positioned over the first portion of the second solder resist layer portion 300*d*. This design allows an encapsulation layer to flow underneath the electrical component and be formed between the electrical component and the second solder resist layer portion 300*d* (or dielectric layer, if there is no second solder resist layer portion 300*d*).

Similarly, the width (e.g., $W_2$) of the second portion of the second solder resist layer portion 300*d* may be bigger (e.g., wider) than the width of the interconnects 306 and 308. The width (e.g., $W_2$) of the second portion of the second solder resist layer portion 300*d* may be bigger (e.g., wider) than the width of an electrical component that may be positioned over the second portion of the second solder resist layer portion 300*d*. This design allows an encapsulation layer to flow underneath the electrical component and be formed between the electrical component and the second solder resist layer portion 300*d* (or dielectric layer, if there is no second solder resist layer portion 300*d*).

FIG. 11 illustrates a profile view of the substrate 1001 across an AA cross-section. The substrate 1001 includes the solder resist layer 250 and the at least one dielectric layer 220. The first solder resist layer portion 300*a* is located around the second solder resist layer portion 300*d*. The second solder resist layer portion 300*d* has a second thickness that is less than a first thickness of the first solder resist layer portion 300*a*. As mentioned above, an electrical component (e.g., 204) and another electrical component (e.g., 206) may be coupled to the substrate 1001 such that the electrical component (e.g., 204) and another electrical component (e.g., 206) are located over the second solder resist layer portion 300*d*.

In some implementations, portions of the second solder resist layer portion 300*d* may not be present, exposing the dielectric layer (e.g., 220). For example, in some implementations, an area between the interconnect 306 and the interconnect 308 may not have the second solder resist layer portion 300*d*, leaving the dielectric layer 220 between the interconnect 306 and the interconnect 308 exposed (which may be subsequently covered by an encapsulation layer). In some implementations, areas of the substrate (e.g., 202, 301, 1001) that are not covered by the first solder resist layer portion 300*a* may have the shape of a cross and/or a double cross. The first solder resist layer portion 300*a* and the second solder resist layer portion 300*d* may be continuous and/or contiguous.

Different implementations may use different substrates and/or different electrical components. For example, a substrate may be a laminated substrate, an organic substrate, a coreless substrate and/or a cored substrate. An electrical component may include a passive device, an integrated passive device, an integrated device, and/or a die.

Figure 12:
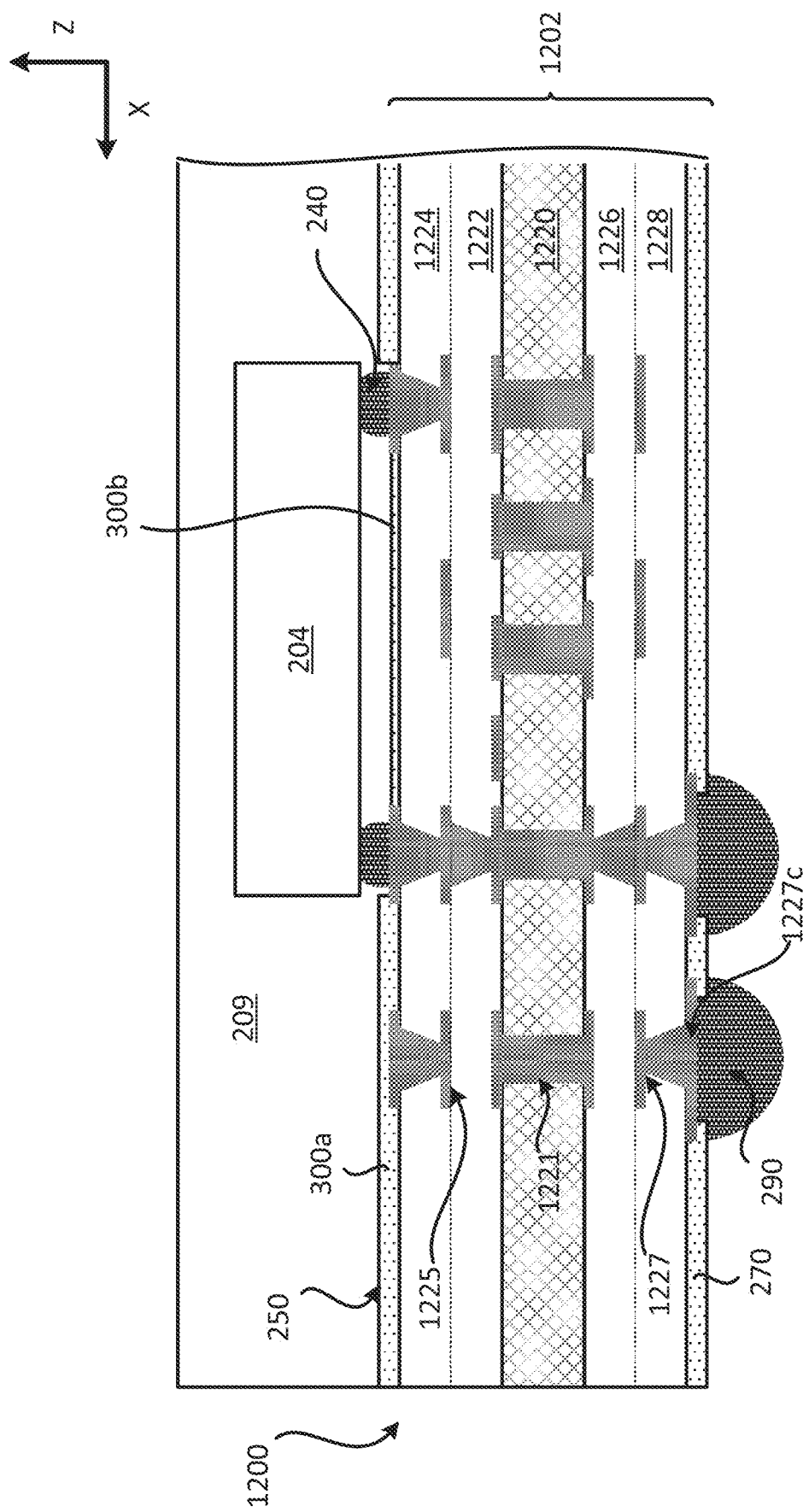
FIG. 12 illustrates a profile view of a package that includes a substrate with a variable thickness solder resist layer.

FIG. 12 illustrates a package 1200 that includes a substrate 1202, an electrical component 204 and an encapsulation layer 209. The substrate 1202 may include a variable thickness solder resist layer. It is noted that any of the solder resist layer designs and configurations described in the disclosure may be implemented in the substrate 1202. The package 1200 may be similar to the package 200, and thus may include similar components and/or be arranged in a similar manner as the package 200. The substrate 1202 may be similar to the substrate 202, and thus may include similar components and/or be arranged in a similar manner as the substrate 202. The substrate 1202 may be a cored substrate. The electrical component 204 is coupled to a first surface (e.g., top surface) of the substrate 1202 through the plurality of solder interconnects 240.

The substrate 1202 may be a laminated substrate that includes a core layer. The substrate 1202 includes a core layer 1220, at least one first dielectric layer (e.g., 1222, 1224), at least one second dielectric layer (e.g., 1226, 1228), the solder resist layer 250, the solder resist layer 270, a plurality of core interconnects 1221, a plurality of interconnects 1225 and a plurality of interconnects 1227. The core layer 1220 may include glass or glass fiber with resin. However, the core layer 1220 may include different materials. The dielectric layers 1222, 1224, 1226 and/or 1228 may each include prepreg (e.g., a prepreg layer). The dielectric layers 1222, 1224, 1226 and/or 1228 may be build up layers. The dielectric layers 1222, 1224, 1226 and/or 1228 may include a different material than the core layer 1220. As will be further described below, different implementations may have different numbers of dielectric layers and/or different numbers of metal layers. FIG. 12 illustrates a substrate that includes 6 metal layers. However, a substrate may include more or less metal layers and/or more or less dielectric layers.

The plurality of interconnects 1225 may include a plurality of surface interconnects. The plurality of interconnects 1227 may include a plurality of surface interconnects. The core layer 1220 includes a first surface and a second surface. The at least one first dielectric layer (e.g., 1222, 1224) is located over the first surface of the core layer 1220. The at least one second dielectric layer (e.g., 1226, 1228) is located over the second surface of the core layer 1220. The solder resist layer 250 is located over the surface of the at least one second dielectric layer 1224. The solder resist layer 270 is located over the surface of the at least one second dielectric layer 1228.

The solder resist layer 250 may include a variable thickness solder resist layer. The solder resist layer 250 includes a first thickness and a second thickness. The solder resist layer 250 includes a first solder resist layer portion 300*a* and a second solder resist layer portion 300*b*. The first solder resist layer portion 300*a* has a first thickness and the second solder resist layer portion 300*b* has a second thickness that is less than the first thickness. The second thickness of the second solder resist layer portion 300*b* may be equal or less than an interconnect thickness of surface interconnects located on the dielectric layer 1224. It is noted that the solder resist layer 270 may have more than two thicknesses. The electrical component 204 is located over the second solder resist layer portion 300*b*. The encapsulation layer 209 may be located between the second solder resist layer portion 300*b* and the electrical component 204.

The solder resist layer 270 may also have different thicknesses across the substrate, in a manner similar to the solder resist layer 250. However, the solder resist layer 270 may have a uniform thickness. A plurality of solder interconnects 290 is coupled to the second surface of the substrate 1202. For example, the plurality of solder interconnects 290 may be coupled to the interconnects 1227*c*.

An electrical component may include a passive device (e.g., capacitor) and/or an integrated device. An integrated device may include a die (e.g., semiconductor bare die). The integrated device may include a radio frequency (RF) device, a passive device, a filter, a capacitor, an inductor, a resistor, an antenna, a transmitter, a receiver, a surface acoustic wave (SAW) filter, a bulk acoustic wave (BAW) filter, a light emitting diode (LED) integrated device, a silicon carbide (SiC) based integrated device, a GaAs based integrated device, a GaN based integrated device, a processor, memory, a power amplifier, a switch, a system on chip, an integrated circuit device, a micro-electromechanical systems (MEMS) device, a nano-electromechanical systems (NEMS) device and/or combinations thereof. An integrated device (e.g., 204, 206) may include at least one electronic circuit (e.g., first electronic circuit, second electronic circuit, etc . . . ).

The package (e.g., 200, 1200) may be implemented in a radio frequency (RF) package. The RF package may be a radio frequency front end package (RFFE). A package (e.g., 200, 1200) may be configured to provide Wireless Fidelity (WiFi) communication and/or cellular communication (e.g., 2G, 3G, 4G, 5G). The packages (e.g., 200, 1200) may be configured to support Global System for Mobile Communications (GSM), Universal Mobile Telecommunications System (UMTS), and/or Long-Term Evolution (LTE). The packages (e.g., 200, 1200) may be configured to transmit and receive signals having different frequencies and/or communication protocols.

Having described various substrates with a variable thickness solder resist layer, a sequence for fabricating a substrate will now be described below.

Exemplary Sequence for Fabricating a Substrate Comprising a Variable Thickness Solder Resist Layer FIGS. 13A-13F illustrate an exemplary sequence for providing or fabricating a substrate that includes a variable thickness solder resist layer. In some implementations, the sequence of FIGS. 13A-13F may be used to provide or fabricate the substrate 1202 of FIG. 12 or any of the substrates described in the disclosure.

It should be noted that the sequence of FIGS. 13A-13F may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure. Different implementations may fabricate a substrate differently.

Figure 13A:
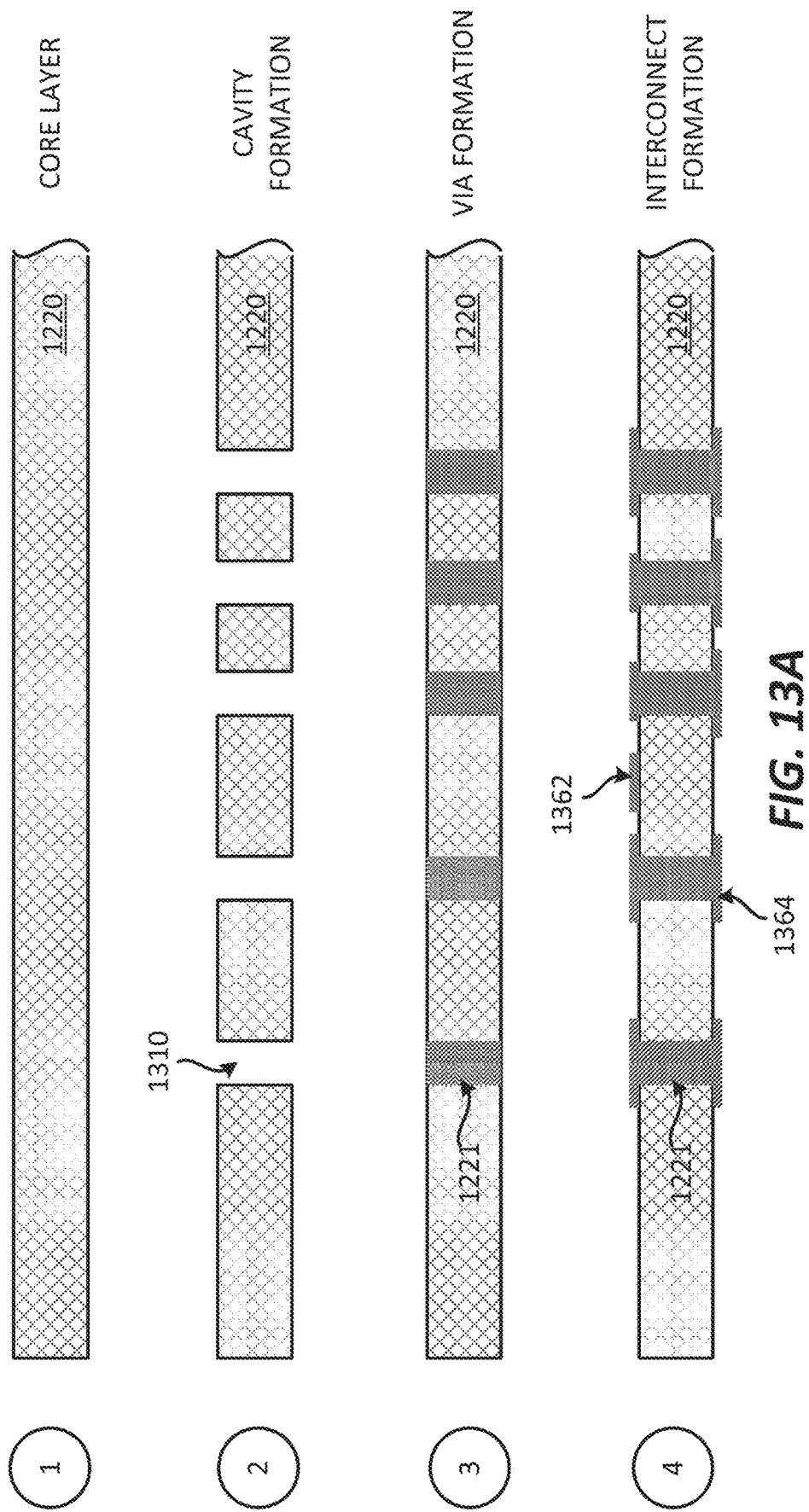

Stage 1, as shown in FIG. 13A, illustrates a state after a core layer 1220 is provided. The core layer 1220 may include glass or glass fiber with resin. However, the core layer 1220 may include different materials. The core layer 1220 may have different thicknesses.

Stage 2 illustrates a state after a plurality of cavities 1310 is formed in the core layer 1220. The plurality of cavities 1310 may be formed through a laser process and/or a drilling process. The plurality of cavities 1310 may travel through the core layer 1220.

Stage 3 illustrates a state after a plurality of core interconnects are formed in the plurality of cavities 1310. For example, a first plurality of core interconnects 1221 may be formed in the plurality of cavities 1310. A plating process may be used to form the first plurality of core interconnects 1221. However, different implementations may use different processes for forming the first plurality of core interconnects 1221. The first plurality of core interconnects 1221 may include core vias located in the core layer 1220.

Stage 4 illustrates a state after a plurality of interconnects 1362 is formed over the first surface (e.g., top surface) of the core layer 1220. The plurality of interconnects 1362 may be coupled to the first plurality of core interconnects 1221. Stage 4 also illustrates a state after a plurality of interconnects 1364 is formed over the second surface (e.g., bottom surface) of the core layer 1220. The plurality of interconnects 1364 may be coupled to the first plurality of core interconnects 1221. A patterning process, a stripping process and/or a plating process may be used to form the plurality of interconnects 1362 and the plurality of interconnects 1364.

Figure 13B:
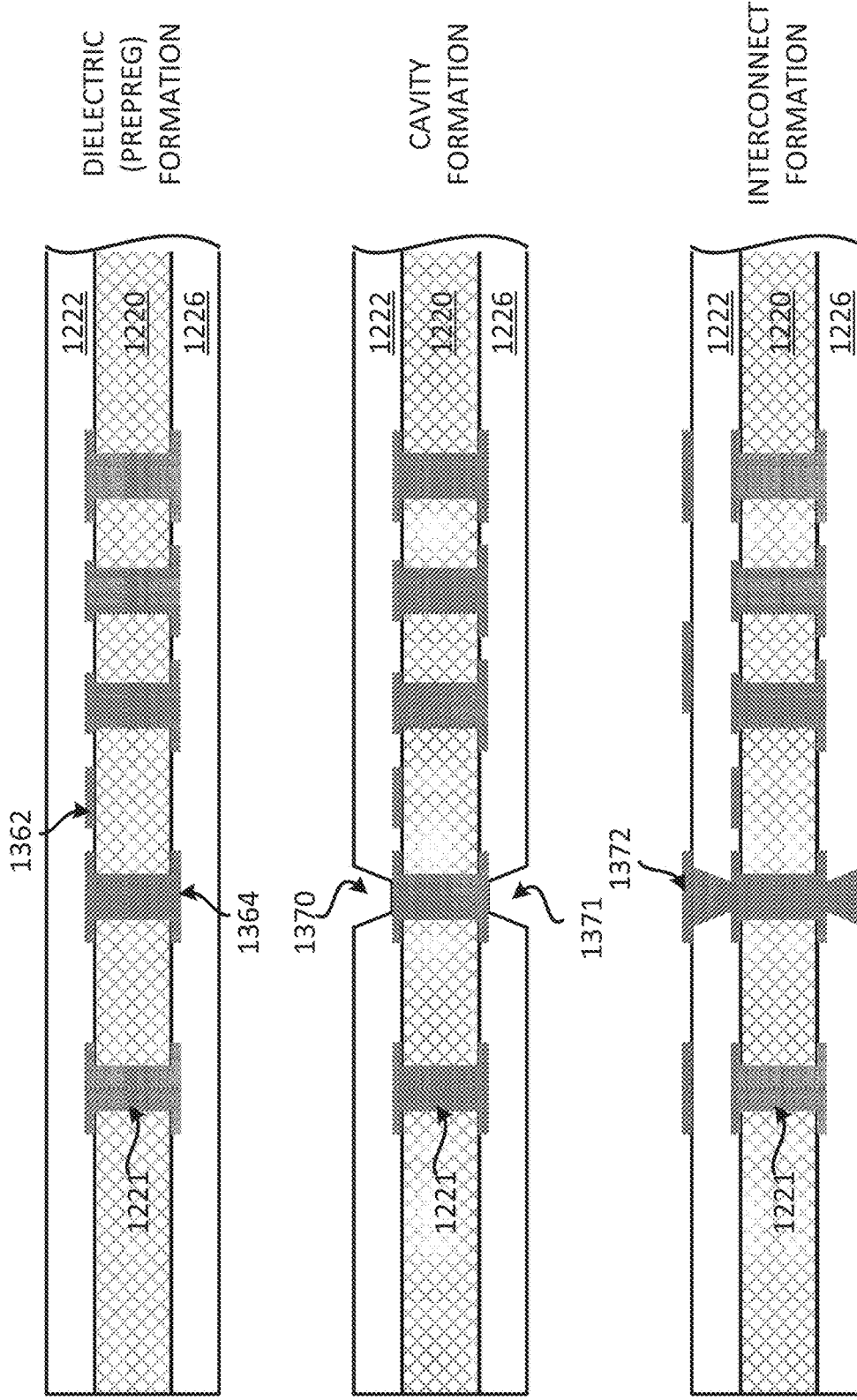

Stage 5, as shown in FIG. 13B, illustrates a state after a dielectric layer 1222 is formed over the first surface of the core layer 1220, and a dielectric layer 1226 is formed over the second surface of the core layer 1220. A deposition process and/or lamination process may be used to form dielectric layers 1222 and 1226. The dielectric layers 1222 and 1226 may include prepreg (e.g., prepreg layers).

Stage 6 illustrates a state after a plurality of cavities 1370 is formed in the dielectric layer 1222, and a plurality of cavities 1371 is formed in the dielectric layer 1226. A laser process (e.g., laser drilling, laser ablation) and/or etching process may be used to form the plurality of cavities 1370 and the plurality of cavities 1371.

Stage 7 illustrates a state after a plurality of interconnects 1372 is formed over and coupled to the dielectric layer 1222 and the plurality of cavities 1370. The plurality of interconnects 1372 may be coupled to the plurality of interconnects 1362. Stage 7 also illustrates a state after a plurality of interconnects 1374 is formed over and coupled the dielectric layer 1226 and the plurality of cavities 1371. The plurality of interconnects 1374 may be coupled to the plurality of interconnects 1364. A patterning process, a stripping process and/or a plating process may be used to form the plurality of interconnects 1372 and the plurality of interconnects 1374.

Figure 13C:
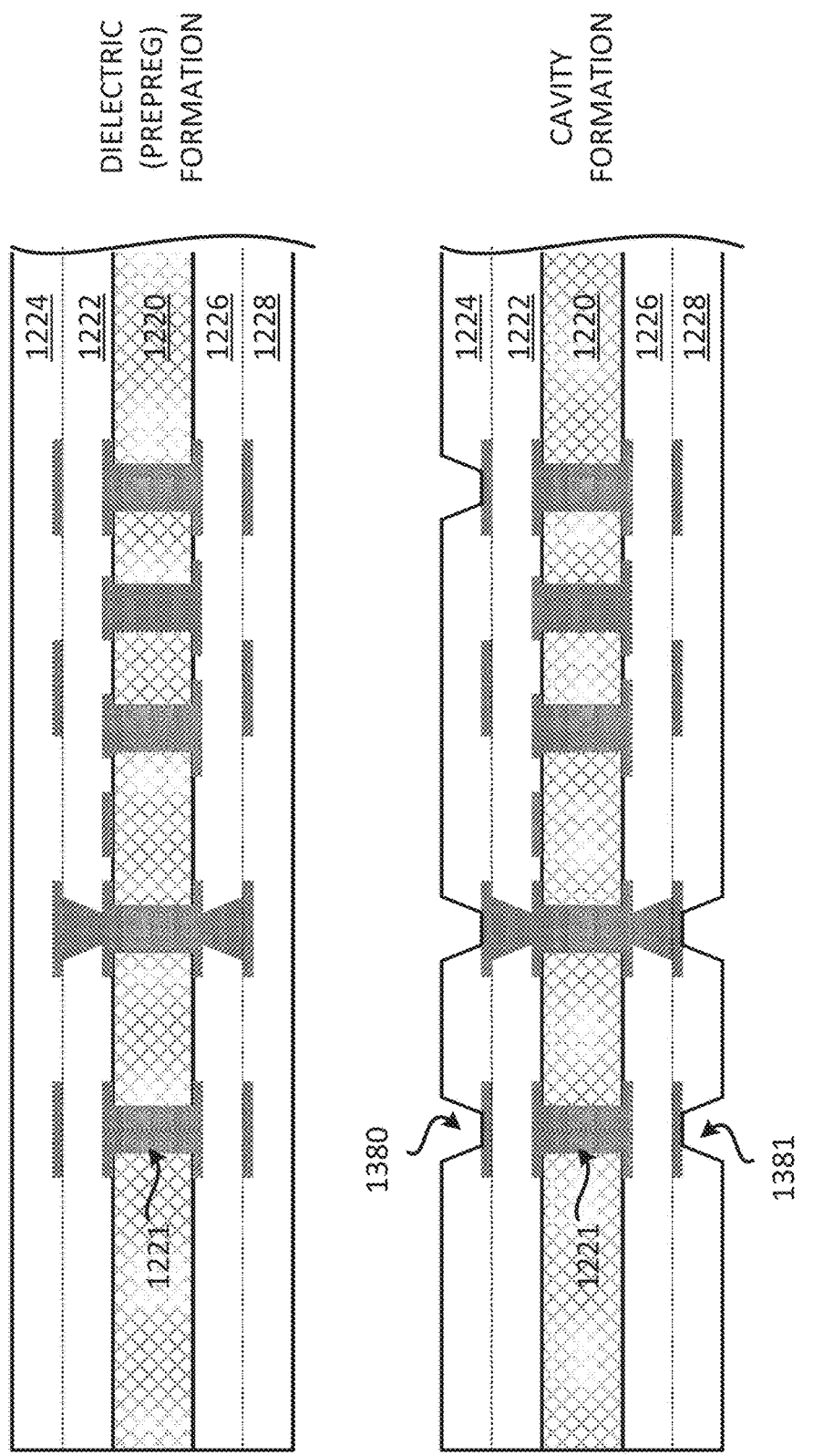

Stage 8, as shown in FIG. 13C, illustrates a state after a dielectric layer 1224 is formed over and coupled to a first surface of dielectric layer 1222, and a dielectric layer 1228 is formed over and coupled to a second surface of the dielectric layer 1226. A deposition process and/or lamination process may be used to form dielectric layers 1224 and 1228. The dielectric layers 1224 and 1228 may include prepreg (e.g., prepreg layers).

Stage 9 illustrates a state after a plurality of cavities 1380 is formed in the dielectric layer 1224, and a plurality of cavities 1381 is formed in the dielectric layer 1228. A laser process (e.g., laser drilling, laser ablation) and/or an etching process may be used to form the plurality of cavities 1380 and the plurality of cavities 1381.

Figure 13D:
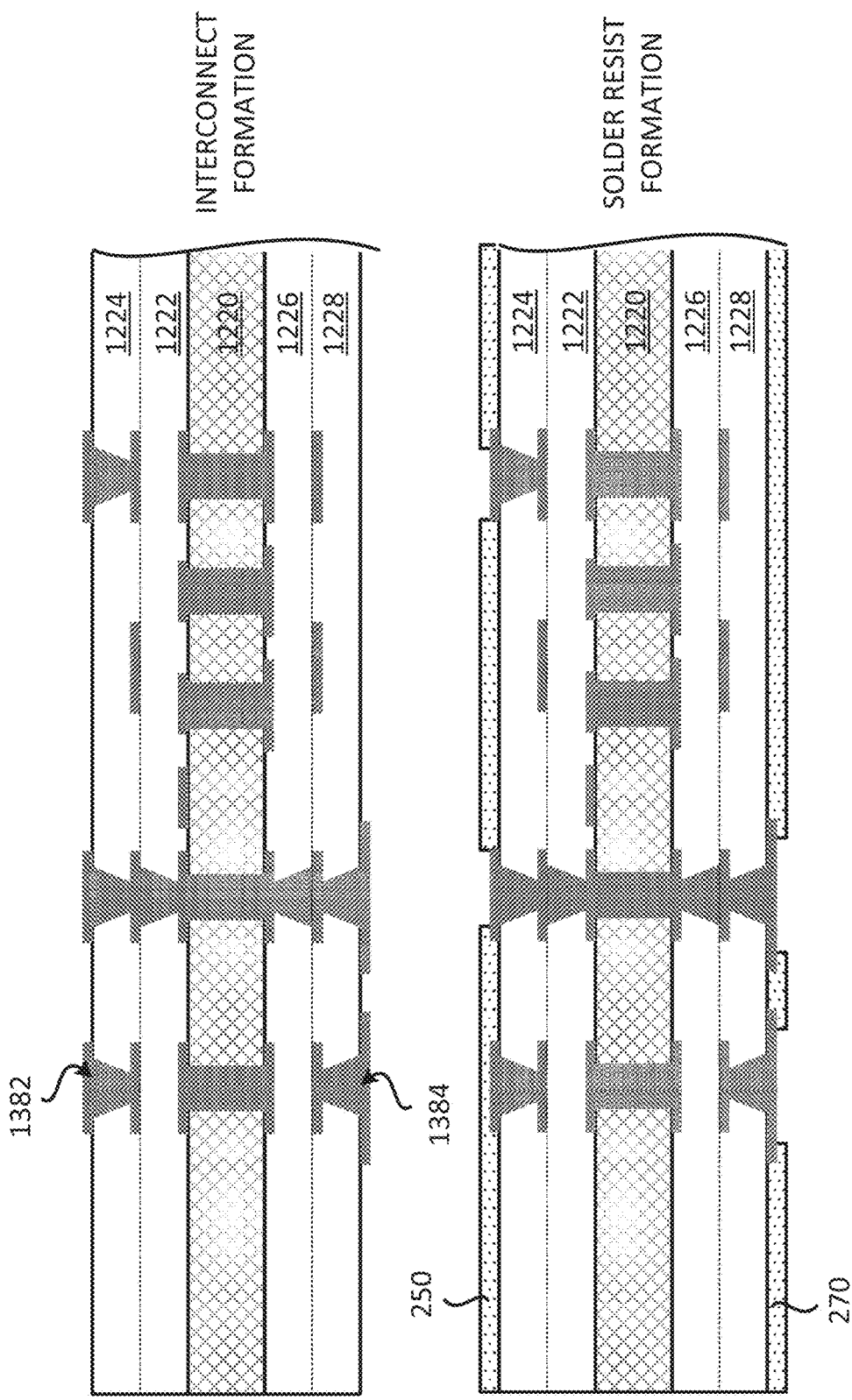

Stage 10, as shown in FIG. 13D, illustrates a state after a plurality of interconnects 1382 is formed over and coupled to the dielectric layer 1224 and the plurality of cavities 1380. The plurality of interconnects 1382 may be coupled to the plurality of interconnects 1372. Stage 10 also illustrates a state after a plurality of interconnects 1384 is formed over and coupled to the dielectric layer 1228 and the plurality of cavities 1381. The plurality of interconnects 1384 may be coupled to the plurality of interconnects 1374. A patterning process, a stripping process and/or a plating process may be used to form the plurality of interconnects 1382 and the plurality of interconnects 1384. It is noted that additional dielectric layers and additional interconnects may be formed by repeating Stages 8-10 of FIGS. 13C-13D, as described above.

Stage 11 illustrates a state after (i) the solder resist layer 250 is formed over the dielectric layer 1224, and (ii) the solder resist layer 270 is formed over the dielectric layer 1228. A deposition process may be used the solder resist layer 250 and the solder resist layer 270. The solder resist layer 250 may have an approximately uniform thickness. Similarly, the solder resist layer 270 may have an approximately uniform thickness.

Stage 12, as shown in FIG. 13E, illustrates a state after a dry film 1320 is located (e.g., formed, placed, deposited) over the solder resist layer 250, covering part of the solder resist layer 250 and exposing part of the solder resist layer 250.

Stage 13 illustrate a state after exposed portions of the solder resist layer 250 has been partially removed. For example, as shown in Stage 13, portions of the solder resist layer 250 may be removed such that the thickness of the remaining solder resist layer 250 is equal or less than the interconnect thickness of interconnects located over the dielectric layer 1224. A sand blasting process may be used to remove portions of the solder resist layer 250. Removing portions of the solder resist layer 250 may include thinning portions of the solder resist layer 250, leaving behind the second solder resist layer portion 300b. The second solder resist layer portion 300b may have a thinner thickness than the first solder resist layer portion 300a.

Figure 13F:
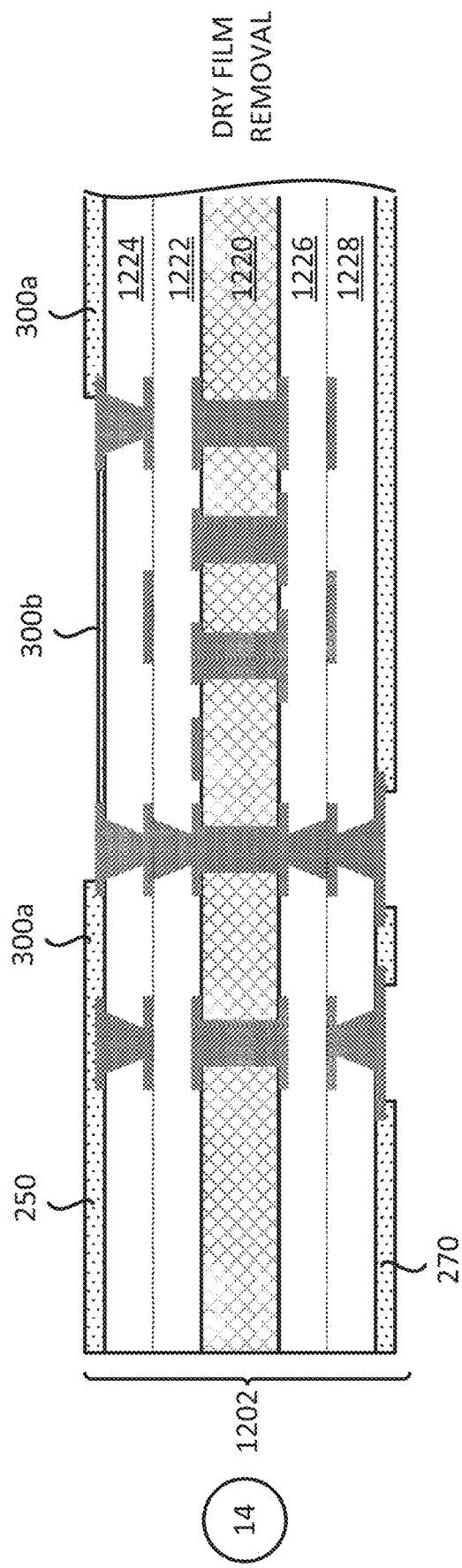

Stage 14, as shown in FIG. 13F, illustrates a state after the dry film 1320 is removed leaving the substrate 1202 with a solder resist layer 250 that includes a first solder resist layer portion 300a and a second solder resist layer portion 300b. The thickness of the second solder resist layer portion 300b is less than the thickness of the first solder resist layer portion 300a. The solder resist layer 270 may also be modified to have variable thicknesses, using the process described in Stages 12-14 of FIGS. 13E-13F.

Figure 14:
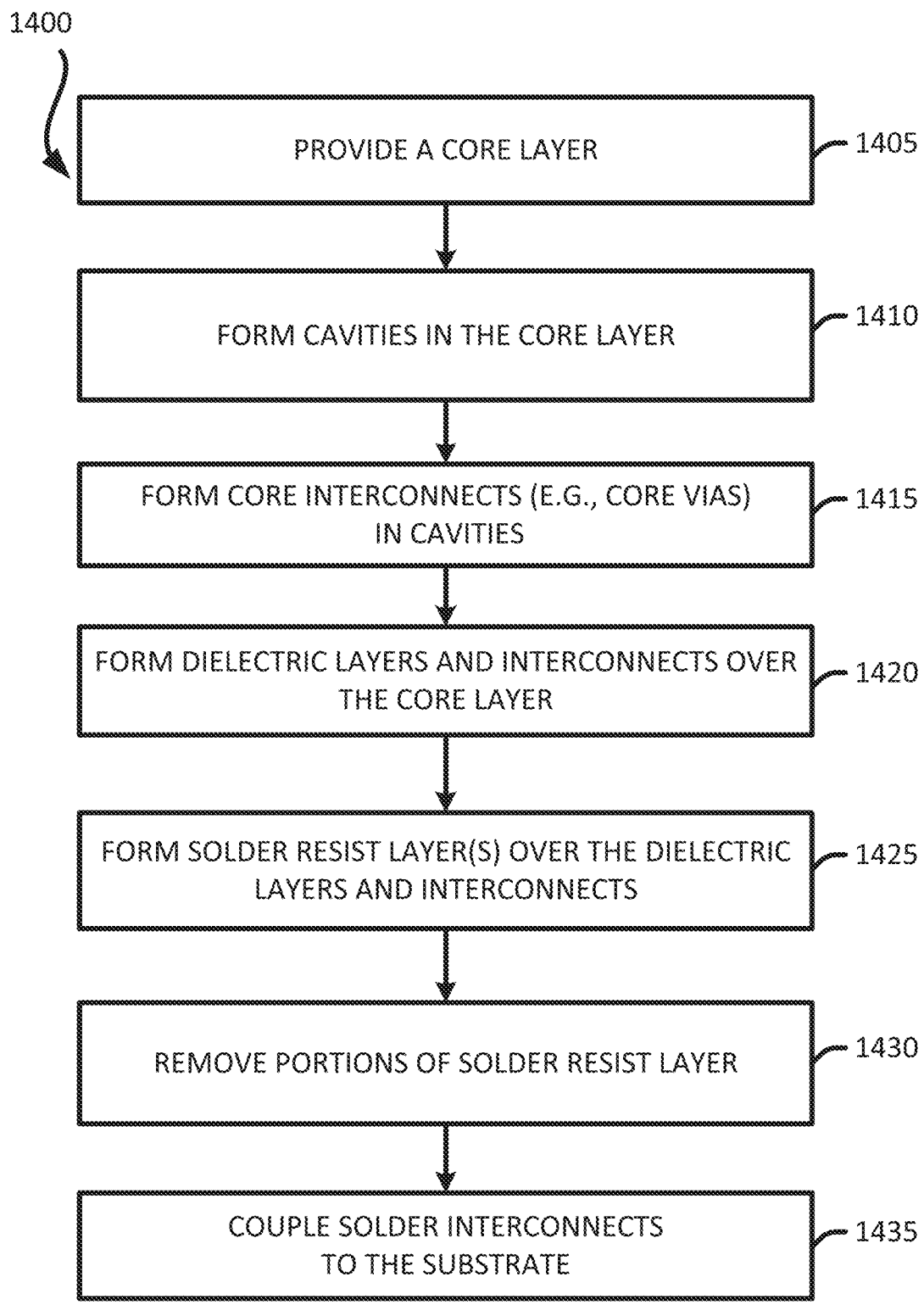
FIG. 14 illustrates an exemplary flow diagram of a method for fabricating a substrate that includes a variable thickness solder resist layer.

Exemplary Flow Diagram of a Method for Fabricating a Substrate with a Variable Thickness Solder Resist Layer In some implementations, fabricating a substrate includes several processes. FIG. 14 illustrates an exemplary flow diagram of a method 1400 for providing or fabricating a substrate with a variable thickness solder resist layer. In some implementations, the method 1400 of FIG. 14 may be used to provide or fabricate the substrate of FIG. 12. For example, the method of FIG. 14 may be used to fabricate the substrate 1202. However, the method of FIG. 14 may be used fabricate any substrate in the disclosure.

It should be noted that the method of FIG. 14 may combine one or more processes in order to simplify and/or clarify the method for providing or fabricating a substrate. In some implementations, the order of the processes may be changed or modified.

The method provides (at 1405) a core layer (e.g., 1220). The core layer 1220 may include glass or glass fiber with resin. However, the core layer 1220 may include different materials. The core layer 1220 may have different thicknesses. It is noted that providing a core layer may be optional. Stage 1 of FIG. 13A illustrates and describes an example of a core layer that is provided.

The method forms (at 1410) a plurality of cavities (e.g., 1310) in the core layer. A laser process or a drilling process may be used to form the cavities. The plurality of cavities may travel through the core layer 1220. Stage 2 of FIG. 13A illustrates and describes examples of forming cavities in the core layer.

The method forms (at 1415) a plurality of core interconnects (e.g., 1221) in the plurality of cavities (e.g., 1310). For example, a first plurality of core interconnects 1221 may be formed in the plurality of cavities 1310. A plating process may be used to form the first plurality of core interconnects 1221. However, different implementations may use different processes for forming the first plurality of core interconnects 1221. The first plurality of core interconnects 1221 may include core vias located in the core layer 1220. Stage 3 of FIG. 13A illustrates and describes an example of core interconnects located in the core layer.

The method forms (at 1420) a plurality of interconnects (e.g., 1225, 1227) and at least one dielectric layer (e.g., 1222, 1224) over a first surface of the core layer and a second surface of the core layer (e.g., 1220). A patterning process, a stripping process and/or a plating process may be used to form the plurality of interconnects. A laser process (e.g., laser drilling, laser ablation) and/or an etching process may be used to form the plurality of cavities in a dielectric layer. A deposition process and/or a lamination process may be used to form at least one dielectric layer. The at least one dielectric layer may include prepreg (e.g., prepreg layer). Stages 5-10 of FIGS. 13B-13D illustrate and describe examples of forming a plurality of interconnects and at least one dielectric layer (e.g., prepreg).

The method forms (at 1425) at least one solder resist layer (e.g., 250) over a first surface of a dielectric layer, and at least one solder resist layer (e.g., 270) over a second surface of a dielectric layer. A deposition process may be used the solder resist layer 250 and the solder resist layer 270. Stage 11 of FIG. 13D illustrates and describes an example of forming solder resist layers over dielectric layers.

The method removes (at 1430) removes portions of the solder resist layer (e.g., 250). Removing portions of the solder resist layer may include thinning portions of the solder resist layer. In some implementations, some portions of the solder resist layer 250 may have a lower thickness than the thickness of the surface interconnects. In some implementations, some portions of the solder resist layer 250 may have a thickness that is equal to the thickness of the surface interconnects. Different implementations may use different processes for removing portions of the solder resist layer. A sand blasting process may be used to remove portions of the solder resist layer 250. Removing portions of the solder resist layer 250 may include thinning portions of the solder resist layer 250 where an electrical component will be placed over the substrate 1202. Removing portions of the solder resist layer may include applying a dry film and performing sand blasting on portions of the solder resist layer that is exposed (e.g., free of the dry film). Once the sand blasting is done, the dry film may be removed. Stages 12-14 of FIGS. 13E-13F illustrate and describe an example of removing portions of a solder resist layer.

The method may couple (at 1435) a plurality of solder interconnects (e.g., 290) to the substrate (e.g., 202,1202). For example, a reflow solder process may be used to couple the plurality of solder interconnects 290 to the plurality of interconnects 1227 of the substrate 1202.

Figure 15B:
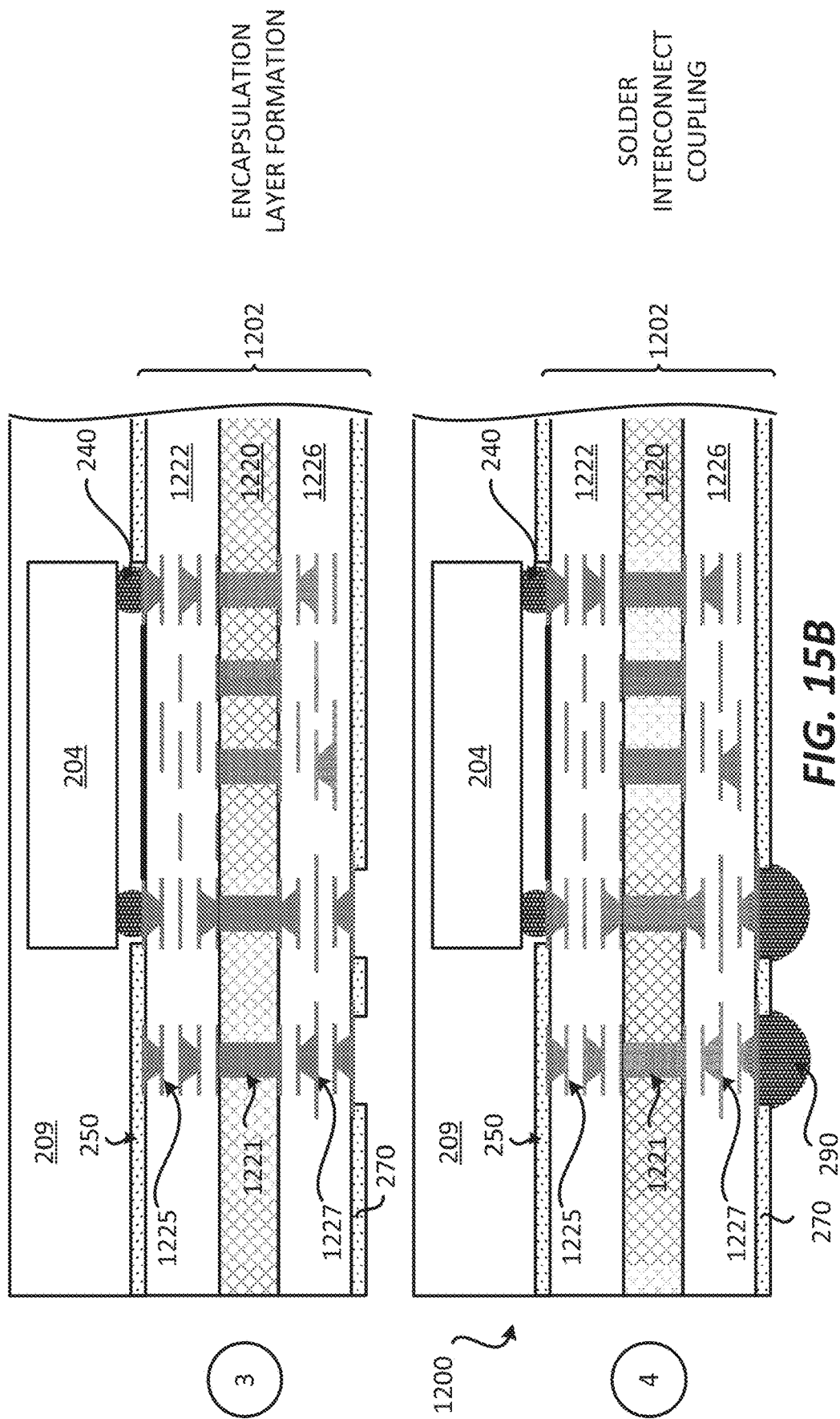

Exemplary Sequence for Fabricating a Package That Includes a Substrate Having a Variable Thickness Solder Resist Layer FIGS. 15A-15B illustrate an exemplary sequence for providing or fabricating a package that includes a substrate with a variable thickness solder resist layer. In some implementations, the sequence of FIGS. 15A-15B may be used to provide or fabricate the package 1200 of FIG. 12, or any of the packages described in the disclosure.

It should be noted that the sequence of FIGS. 15A-15B may combine one or more stages in order to simplify and/or clarify the sequence for providing or fabricating a package. In some implementations, the order of the processes may be changed or modified. In some implementations, one or more of processes may be replaced or substituted without departing from the spirit of the disclosure. Different implementations may fabricate a package differently.

Stage 1, as shown in FIG. 15A, illustrates a state after a substrate 1202 is provided. The substrate 1202 may be provided using the process described in FIG. 13A-13F. The substrate 1202 includes a core layer 1020, at least one dielectric layer 1222, at least one dielectric layer 1226, a plurality of interconnects 1225, a plurality of interconnects 1227, a solder resist layer 250 and a solder resist layer 270. The substrate 1202 includes a solder resist layer with different thicknesses. For example, the solder resist layer 250 may include a first solder resist layer portion 300a with a first thickness and a second solder resist layer portion 300b with a second thickness, where the second thickness is less than the first thickness. In some implementations, there may not be the second solder resist layer portion 300b.

Stage 2 illustrates a state after an electrical component 204 is coupled to the substrate 1202 through the plurality of solder interconnects 240. A pick and place process may be used to place the electrical component 204 over a first surface of the substrate 1202. A solder reflow process may be used to couple the electrical component 204 to the substrate 1202. The electrical component 204 may be coupled to the plurality of interconnects 1225 through the plurality of solder interconnects 240. Different implementations may couple a different number of electrical components to the substrate 1202.

Stage 3, as shown in FIG. 15B, illustrates a state after an encapsulation layer 209 is provided. The encapsulation layer 209 may encapsulate the electrical component 204. The encapsulation layer 209 may be coupled to a surface of the substrate 1202. The encapsulation layer 209 may be formed over the substrate 1202 and the electrical component 204. The encapsulation layer 209 may include a mold, a resin and/or an epoxy. The encapsulation layer 209 may be a means for encapsulation. A compression and transfer molding process, a sheet molding process, or a liquid molding process may be used to form the encapsulation layer.

Stage 4 illustrates a state a plurality of solder interconnects 290 is coupled to the substrate 1202. A solder reflow process may be used to couple the plurality of solder interconnects 290 to the substrate 1202. Stage 4 may illustrate the package 1200 that includes the substrate 1202, the electrical component 204 and the encapsulation layer 209.

Figure 16:
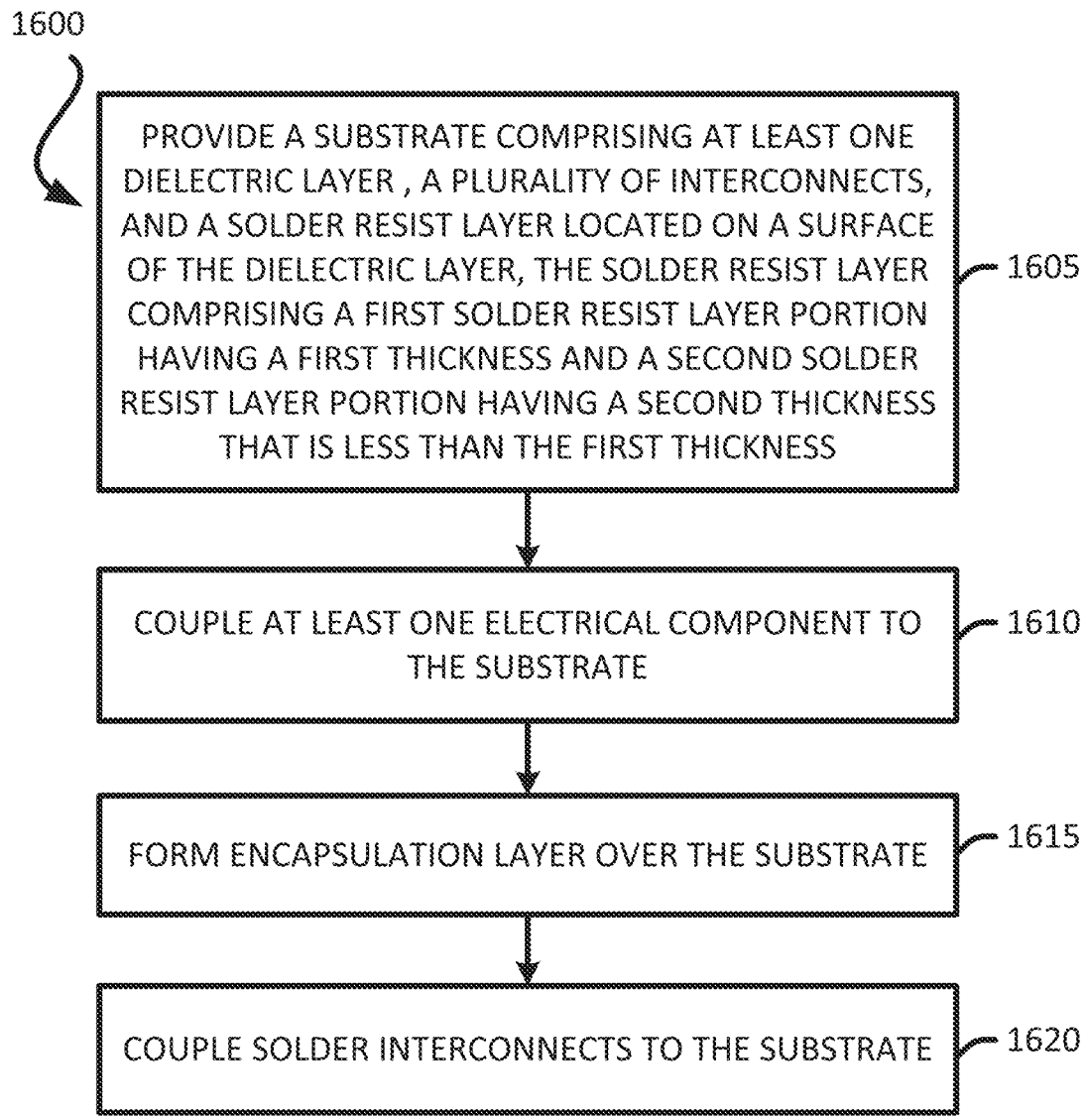
FIG. 16 illustrates an exemplary flow diagram of a method for fabricating a package that includes a substrate with a variable thickness solder resist layer.

Exemplary Flow Diagram of a Method for Fabricating a Package Having a Substrate with a Variable Thickness Solder Resist Layer In some implementations, fabricating a package includes several processes. FIG. 16 illustrates an exemplary flow diagram of a method 1600 for providing or fabricating a package. In some implementations, the method 1600 of FIG. 16 may be used to provide or fabricate the package of FIG. 12. For example, the method of FIG. 16 may be used to fabricate the package 1200. However, the method of FIG. 16 may be used fabricate any package in the disclosure.

It should be noted that the method of FIG. 16 may combine one or more processes in order to simplify and/or clarify the method for providing or fabricating a package. In some implementations, the order of the processes may be changed or modified.

The method provides (at 1605) a substrate (e.g., 202, 1202) that includes a variable thickness solder resist layer. The substrate may include at least one dielectric layer (e.g., 220, 1222, 1224, 1226, 1228), a plurality of interconnects (e.g., 222, 1225, 1227), and at least one solder resist layer (e.g., 250, 270). A solder resist layer may have portions with different thicknesses. For example, the solder resist layer 250 may include a first solder resist layer portion 300a with a first thickness and a second solder resist layer portion 300b with a second thickness, where the second thickness is less than the first thickness. The substrate may be provided using the process described in FIG. 13A-13F.

The method couples (at 1610) at least one electrical component (e.g., 204) to the substrate (e.g., 202, 1202). A pick and place process may be used to place the at least one electrical component over a first surface of the substrate. A solder reflow process may be used to couple the electrical component to the substrate. Different implementations may couple a different number of electrical components to the substrate. Stage 2 of FIG. 15A illustrates and describes an example of coupling at least one electrical component to the substrate.

The method forms (at 1615) an encapsulation layer (e.g., 209) over the substrate (e.g., 1202). The encapsulation layer (e.g., 209) may encapsulate the at least one electrical component (e.g., 204). The encapsulation layer may be coupled to a surface of the substrate. The encapsulation layer may include a mold, a resin and/or an epoxy. A compression and transfer molding process, a sheet molding process, or a liquid molding process may be used to form the encapsulation layer. Stage 3 of FIG. 15B illustrates and describes an encapsulation layer that is located over a substrate.

The method couples (at 1620) a plurality of solder interconnects (e.g., 290) to the substrate (e.g., 1202). A solder reflow process may be used to couple the plurality of solder interconnects to the substrate. Stage 4 of FIG. 15B illustrates and describes an example of coupling solder interconnects to the substrate.

Exemplary Electronic Devices

Figure 17:
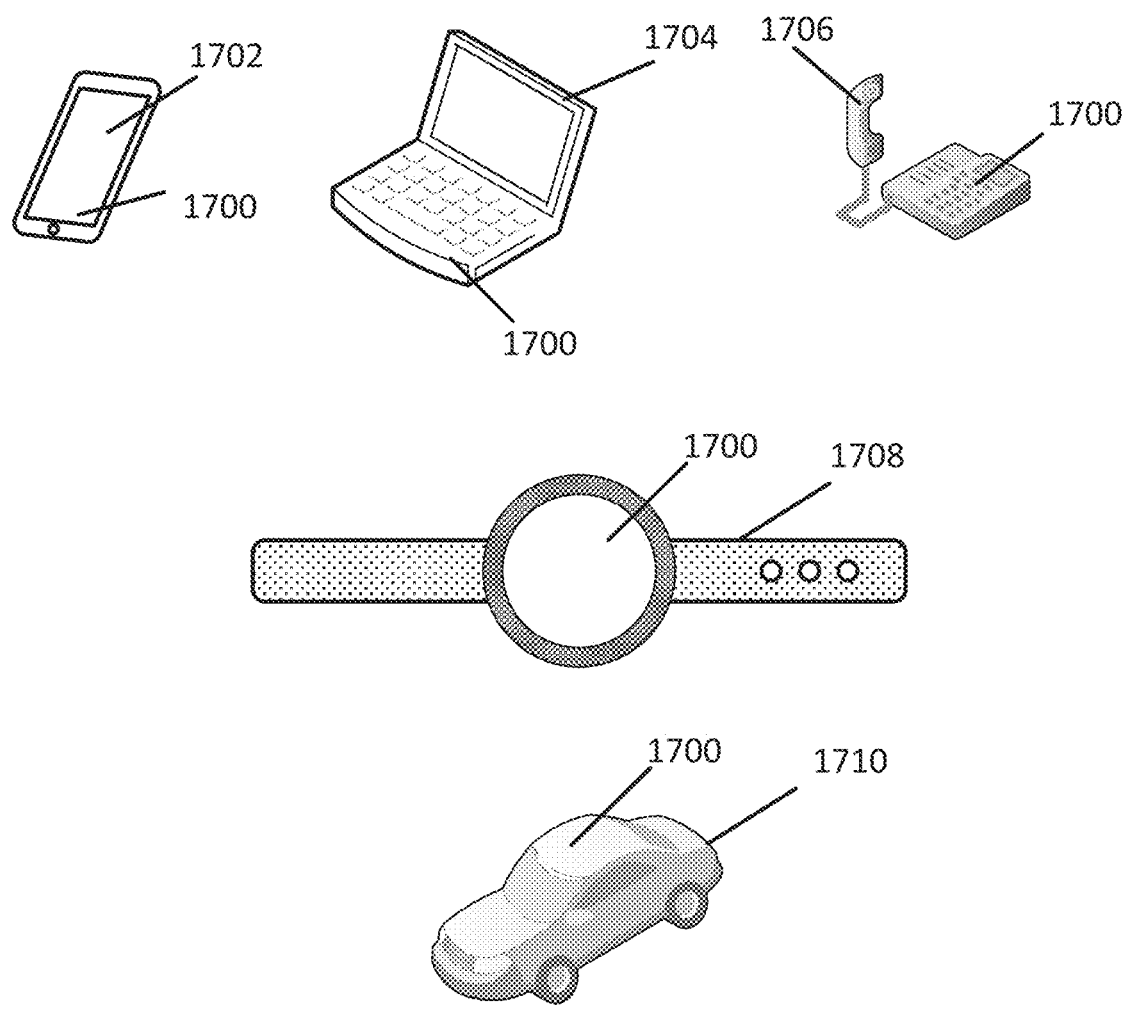
FIG. 17 illustrates various electronic devices that may integrate a die, an electronic circuit, an integrated device, an integrated passive device (IPD), a passive component, a package, and/or a device package described herein.

FIG. 17 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1702, a laptop computer device 1704, a fixed location terminal device 1706, a wearable device 1708, or automotive vehicle 1710 may include a device 1700 as described herein. The device 1700 may be, for example, any of the devices and/or integrated circuit (IC) packages described herein. The devices 1702, 1704, 1706 and 1708 and the vehicle 1710 illustrated in FIG. 17 are merely exemplary. Other electronic devices may also feature the device 1700 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-12, 13A-13F, 14, 15A-15B, 16 and/or 17 may be rearranged and/or combined into a single component, process, feature or function or embodied in several components, processes, or functions. Additional elements, components, processes, and/or functions may also be added without departing from the disclosure. It should also be noted FIGS. 2-12, 13A-13F, 14, 15A-15B, 16 and/or 17 and its corresponding description in the present disclosure is not limited to dies and/or ICs. In some implementations, FIGS. 2-12, 13A-13F, 14, 15A-15B, 16 and/or 17 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a signal (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A substrate comprising at least one dielectric layer; a plurality of interconnects located in the at least one dielectric layer; and a solder resist layer located over a surface of the at least one dielectric layer. The solder resist layer comprises a first solder resist layer portion comprising a first thickness; and a second solder resist layer portion comprising a second thickness that is less than the first thickness.

Aspect 2: The substrate of aspect 1, wherein the plurality of interconnects includes a plurality of surface interconnects located on the surface of the at least one dielectric layer.

Aspect 3: The substrate of aspects 1 through 2, wherein the plurality of surface interconnects includes an interconnect thickness that is less than the first thickness.

Aspect 4: The substrate of aspect 3, wherein the interconnect thickness of the plurality of surface interconnects is equal or greater than the second thickness.

Aspect 5: The substrate of aspects 1 through 4, wherein the solder resist layer further comprises a third solder resist layer portion comprising the second thickness.

Aspect 6: The substrate of aspect 5, wherein the second solder resist layer portion and the third solder resist layer portion are separated by approximately 45 micrometers.

Aspect 7: The substrate of aspects 5 through 6, wherein the first solder resist layer portion is located between the second solder resist layer portion and the third solder resist layer portion, wherein the first solder resist layer portion, the second solder resist layer portion and/or the third solder resist layer portion are continuous portions and/or contiguous portions of the solder resist layer.

Aspect 8: The substrate of aspect 1 through 7, further comprising a first opening in the solder resist layer, and a second opening in the solder resist layer, wherein the second opening and the first opening are separated by approximately 45 micrometers or less. The first opening is located over the second solder resist layer portion, and the second opening is located over the third solder resist layer portion. The first opening is at least partially filled with an encapsulation layer. The second opening is at least partially filled with the encapsulation layer.

Aspect 9: A package comprising a substrate and an electrical component coupled to the substrate. The substrate comprising at least one dielectric layer; a plurality of interconnects located in the at least one dielectric layer; and a solder resist layer located over a surface of the at least one dielectric layer. The solder resist layer comprises a first solder resist layer portion comprising a first thickness; and a second solder resist layer portion comprising a second thickness that is less than the first thickness. The electrical component is located over a second solder resist layer portion.

Aspect 10: The package of aspect 9, wherein the plurality of interconnects includes a plurality of surface interconnects located on the surface of the at least one dielectric layer, and wherein the electrical component is located over the plurality of surface interconnects.

Aspect 11: The package of aspects 9 through 10, wherein the plurality of surface interconnects includes an interconnect thickness that is less than the first thickness.

Aspect 12: The package of aspect 11, wherein the interconnect thickness of the plurality of surface interconnects is equal or greater than the second thickness.

Aspect 13: The package of aspects 9 through 12, further comprising another electrical component, wherein the solder resist layer further comprises a third solder resist layer portion comprising the second thickness.

Aspect 14: The package of aspects 9 through 13, wherein the second solder resist layer portion and the third solder resist layer portion are separated by approximately 45 micrometers.

Aspect 15: The package of aspects 9 through 13, wherein the first solder resist layer portion is located between the second solder resist layer portion and the third solder resist layer portion, wherein the first solder resist layer portion, the second solder resist layer portion and/or the third solder resist layer portion are continuous portions and/or contiguous portions of the solder resist layer.

Aspect 16: The package of aspects 9 through 15, wherein the substrate comprises a first cavity in the solder resist layer; and a second cavity in the solder resist layer, wherein the second cavity and the first cavity are separated by approximately 45 micrometers or less, wherein the electrical component is located over the first cavity of the solder resist layer, and wherein the package further comprises a second electrical component located over the second cavity of the solder resist layer. The width of the first cavity is greater than the width of the electrical component. The width of the second cavity is greater than the width of the another electrical component.

Aspect 17: The package of aspect 16, wherein the first cavity is located over the second solder resist layer portion, and wherein the second cavity is located over the third solder resist layer portion. The first cavity is at least partially filled with an encapsulation layer. The second cavity is at least partially filled with the encapsulation layer. The width of the second solder resist layer portion is greater than the width of the electrical component. The width of the third solder resist layer portion is greater than the width of the another electrical component.

Aspect 18: The package of aspects 9 through 17, wherein the electrical component includes a passive component, an integrated device and/or a passive integrated device.

Aspect 19: The package of aspects 9 through 18, wherein the substrate is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 20: A method for fabricating a substrate. The method forms at least one dielectric layer. The method forms a plurality of interconnects in the at least one dielectric layer. The method forms a solder resist layer over a surface of the at least one dielectric layer. Forming the solder resist layer comprises forming a first solder resist layer portion comprising a first thickness; and forming a second solder resist layer portion comprising a second thickness that is less than the first thickness.

Aspect 21: The method of aspect 20, wherein forming the plurality of interconnects includes forming a plurality of surface interconnects located on the surface of the at least one dielectric layer.

Aspect 22: The method of aspect 21, wherein forming the plurality of surface interconnects includes forming an interconnect thickness that is less than the first thickness.

Aspect 23: The method of aspect 22, wherein the interconnect thickness of the plurality of surface interconnects is equal or greater than the second thickness.

Aspect 24: The method of aspects 20 through 23, wherein forming the solder resist layer further comprises forming a third solder resist layer portion comprising the second thickness.

Aspect 25: The method of aspects 20 through 24, wherein the second solder resist layer portion and the third solder resist layer portion are separated by approximately 45 micrometers.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising:
   a substrate comprising:
      at least one dielectric layer;
      a plurality of interconnects located in the at least one dielectric layer;
      a first plurality of surface interconnects located on a surface of the at least one dielectric layer;
      a second plurality of surface interconnects located on the surface of the at least one dielectric layer; and
      a solder resist layer located over the surface of the at least one dielectric layer, wherein the solder resist layer comprises:
         a first solder resist layer portion comprising a first thickness;
         a second solder resist layer portion comprising a second thickness that is less than the first thickness; and
         a third solder resist layer portion comprising a third thickness that is less than the first thickness;
   a first electrical component coupled to the first plurality of surface interconnects of the substrate, wherein the first electrical component is located over the second solder resist layer portion, wherein the first electrical component has a first width that is less than a width of the of the second solder resist layer portion;
   a second electrical component coupled to the second plurality of surface interconnects of the substrate, wherein the second electrical component is located over the third solder resist layer portion, wherein the second electrical component has a second width that is less than a width of the third solder resist layer portion; and an encapsulation layer coupled to the substrate,
  wherein the encapsulation layer is located over the substrate, the first electrical component and the second electrical component, and
  wherein the encapsulation layer is further located underneath the first electrical component and the second electrical component.

2. The device of claim 1,
  wherein the first plurality of surface interconnects include a first surface interconnect that has a width that is less than the width of the second solder resist layer portion; and
  wherein the second plurality of surface interconnects include a second surface interconnect that has a width that is less than the width of the third solder resist layer.

3. The device of claim 1, wherein the first plurality of surface interconnects includes an interconnect thickness that is less than the first thickness.

4. The device of claim 3, wherein the interconnect thickness of the first plurality of surface interconnects is equal or greater than the second thickness.

5. The device of claim 1, wherein the second solder resist layer portion and the third solder resist layer portion are part of one opening in the solder resist layer.

6. The device of claim 1, wherein the second solder resist layer portion and the third solder resist layer portion are separated by approximately 45 micrometers or less.

7. The device of claim 1, wherein part of the first solder resist layer portion is located between the second solder resist layer portion and the third solder resist layer portion.

8. The device of claim 1, further comprising:
  a first opening in the solder resist layer, wherein the first opening is located over the second solder resist layer portion; and
  a second opening in the solder resist layer, wherein the second opening is located over the third solder resist layer portion, wherein the second opening and the first opening are separated by approximately 45 micrometers or less.

9. A package comprising:
  a substrate comprising:
    at least one dielectric layer;
    a plurality of interconnects located in the at least one dielectric layer;
    a solder resist layer located over a surface of the at least one dielectric layer, wherein the solder resist layer comprises:
      a first solder resist layer portion comprising a first thickness;
      a second solder resist layer portion comprising a second thickness that is less than the first thickness;
      a first cavity in the solder resist layer,
        wherein the first cavity has a first width, and
        wherein the first cavity is located over the second solder resist layer portion,
      a third solder resist layer portion comprising a third thickness that is less than the first thickness; and
      a second cavity in the solder resist layer,
        wherein the second cavity has a second width, and
        wherein the second cavity is located over the third solder resist layer portion;
  a first electrical component coupled to the substrate, wherein the first electrical component is located over the second solder resist layer portion and the first cavity in the solder resist layer, wherein the first width of the first cavity in the solder resist layer is greater than a width of the first electrical component;
  a second electrical component coupled to the substrate, wherein the second electrical component is located over the third solder resist layer portion and the second cavity in the solder resist layer, wherein the second width of the second cavity in the solder resist layer is greater than a width of the second electrical component; and
  an encapsulation layer coupled to the substrate,
    wherein the encapsulation layer is located over the substrate, the first electrical component and the second electrical component, and
    wherein the encapsulation layer is further located (i) between the first electrical component and the substrate, and (ii) between the second electrical component and the substrate.

10. The package of claim 9, further comprising:
  a first plurality of surface interconnects located on the surface of the at least one dielectric layer, and
  wherein the first electrical component is located over the first plurality of surface interconnects.

11. The package of claim 10, wherein the first plurality of surface interconnects includes an interconnect thickness that is less than the first thickness.

12. The package of claim 11, wherein the interconnect thickness of the first plurality of surface interconnects is equal or greater than the second thickness.

13. The package of claim 9,
  wherein the third thickness is the same as the second thickness.

14. The package of claim 13, wherein a center to center distance between the second solder resist layer portion and the third solder resist layer portion is approximately 45 micrometers or less.

15. The package of claim 13, wherein part of the first solder resist layer portion is located between the second solder resist layer portion and the third solder resist layer portion.

16. The package of claim 13, wherein the first cavity and the second cavity are part of the a same cavity.

17. The package of claim 16,
  wherein the first cavity is at least partially filled with the encapsulation layer,
  wherein the second cavity is at least partially filled with the encapsulation layer.

18. The package of claim 9, wherein the first electrical component includes a passive component, an integrated device and/or a passive integrated device.

19. The package of claim 9, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

20. A method for fabricating a substrate, comprising:
  forming at least one dielectric layer;
  forming a plurality of interconnects in the at least one dielectric layer;
  forming a first plurality of surface interconnects on a surface of the at least one dielectric layer, wherein forming the first plurality of surface interconnects includes forming a first surface interconnect comprising a first width;

forming a second plurality of surface interconnects on a surface of the at least one dielectric layer, wherein forming the second plurality of surface interconnects includes forming a second surface interconnect comprising a second width; and forming a solder resist layer over a surface of the at least one dielectric layer, wherein forming the solder resist layer comprises:
- forming a first solder resist layer portion comprising a first thickness in a range of about 12-15 micrometers;
- forming a second solder resist layer portion comprising a second thickness that is less than the first thickness, wherein the second solder resist layer portion has a width that is greater than first width of the first surface interconnect, wherein the second thickness is in a range of about 1-12 micrometers; and
- forming a third solder resist layer portion comprising a third thickness that is less than the first thickness, wherein the third solder resist layer portion has a width that is greater than second width of the second surface interconnect, wherein the second thickness is in a range of about 1-12 micrometers.

21. The method of claim 20, wherein forming the solder resist layer comprises:
- forming a first opening in the solder resist layer, wherein the first opening is located over the second solder resist layer portion; and
- forming a second opening in the solder resist layer, wherein the second opening is located over the third solder resist layer portion.

22. The method of claim 20, wherein forming the first plurality of surface interconnects includes forming an interconnect thickness that is less than the first thickness.

23. The method of claim 22, wherein the interconnect thickness of the first plurality of surface interconnects is equal or greater than the second thickness.

24. The method of claim 20, wherein forming the solder resist layer portion comprises forming the third solder resist layer portion between two surface interconnects from the second plurality of surface interconnects.

25. The method of claim 20, wherein the second solder resist layer portion and the third solder resist layer portion are separated by approximately 45 micrometers or less.

* * * * *